United States Patent
Rajski et al.

(10) Patent No.: US 7,805,651 B2
(45) Date of Patent: Sep. 28, 2010

(54) PHASE SHIFTER WITH REDUCED LINEAR DEPENDENCY

(75) Inventors: Janusz Rajski, West Linn, OR (US); Jerzy Tyszer, Poznan (PL); Nagesh Tamarapalli, Wilsonville, OR (US)

(73) Assignee: Mentor Graphics Corporation

( * ) Notice: Subject to any disclaimer, the term of this patent is extended or adjusted under 35 U.S.C. 154(b) by 0 days.

(21) Appl. No.: 12/633,601

(22) Filed: Dec. 8, 2009

(65) Prior Publication Data

US 2010/0083063 A1    Apr. 1, 2010

Related U.S. Application Data

(63) Continuation of application No. 12/412,267, filed on Mar. 26, 2009, now Pat. No. 7,653,851, which is a continuation of application No. 11/895,845, filed on Aug. 27, 2007, now Pat. No. 7,523,372, which is a continuation of application No. 10/911,033, filed on Aug. 3, 2004, now Pat. No. 7,263,641, which is a continuation of application No. 09/713,662, filed on Nov. 15, 2000, now Pat. No. 6,874,109.

(60) Provisional application No. 60/167,448, filed on Nov. 23, 1999.

(51) Int. Cl.
  G01R 31/28    (2006.01)
(52) U.S. Cl. ........................ 714/733; 714/729
(58) Field of Classification Search ................. 365/244; 380/28; 711/100; 382/276; 326/46; 714/726, 714/739, 729, 727, 733
See application file for complete search history.

(56) References Cited

U.S. PATENT DOCUMENTS

| | | | |
|---|---|---|---|
| 519,078 A | 5/1894 | Wilson | |
| 713,605 A | 11/1902 | Churchward | |
| 2,652,529 A * | 9/1953 | Alexanderson | 323/210 |
| 2,793,347 A * | 5/1957 | Clark | 324/89 |
| 3,614,400 A | 10/1971 | Farnett | |
| 3,700,869 A | 10/1972 | Low et al. | |
| 4,024,460 A | 5/1977 | Vifian | |
| 4,122,399 A | 10/1978 | Heiter et al. | |
| 4,161,041 A | 7/1979 | Butler et al. | |

(Continued)

FOREIGN PATENT DOCUMENTS

EP    0 108 256    5/1984

(Continued)

OTHER PUBLICATIONS

U.S. Appl. No. 09/619,985, filed Jul. 20, 2000, Rajski et al.

(Continued)

*Primary Examiner*—David Ton
(74) *Attorney, Agent, or Firm*—Klarquist Sparkman, LLP

(57) ABSTRACT

A method is disclosed for the automated synthesis of phase shifters—circuits used to remove effects of structural dependencies featured by pseudo-random test pattern generators driving parallel scan chains. Using a concept of duality, the method relates the logical states of linear feedback shift registers (LFSRs) and circuits spacing their inputs to each of the output channels. The method generates a phase shifter network balancing the loads of successive stages of LFSRs and satisfying criteria of reduced linear dependency, channel separation and circuit complexity.

14 Claims, 10 Drawing Sheets

U.S. PATENT DOCUMENTS

| | | | |
|---|---|---|---|
| 4,320,509 A | 3/1982 | Davidson |
| 4,503,537 A | 3/1985 | McAnney |
| 4,513,418 A | 4/1985 | Bardell, Jr. et al. |
| 4,536,881 A | 8/1985 | Kasuya |
| 4,602,210 A | 7/1986 | Fasang et al. |
| 4,687,988 A | 8/1987 | Eichelberger et al. |
| 4,754,215 A | 6/1988 | Kawai |
| 4,785,410 A | 11/1988 | Hamatsu et al. |
| 4,801,870 A | 1/1989 | Eichelberger et al. |
| 4,827,476 A | 5/1989 | Garcia |
| 4,860,236 A | 8/1989 | McLeod et al. |
| 4,910,735 A | 3/1990 | Yamashita |
| 4,959,832 A | 9/1990 | Bardell, Jr. |
| 4,974,184 A | 11/1990 | Avra |
| 5,072,178 A | 12/1991 | Matsumoto |
| 5,090,035 A | 2/1992 | Murase |
| 5,138,619 A | 8/1992 | Fasang et al. |
| 5,167,034 A | 11/1992 | MacLean, Jr. et al. |
| 5,173,906 A | 12/1992 | Dreibelbis et al. |
| 5,202,889 A | 4/1993 | Aharon et al. |
| 5,258,986 A | 11/1993 | Zerbe |
| 5,268,949 A | 12/1993 | Watanabe et al. |
| 5,293,123 A | 3/1994 | Jordan et al. |
| 5,301,199 A | 4/1994 | Ikenaga et al. |
| 5,325,367 A | 6/1994 | Dekker et al. |
| 5,349,587 A | 9/1994 | Nadeau-Dostie et al. |
| 5,369,648 A | 11/1994 | Nelson |
| 5,394,405 A | 2/1995 | Savir |
| 5,412,665 A | 5/1995 | Gruodis et al. |
| 5,414,716 A | 5/1995 | Bershteyn |
| 5,416,783 A | 5/1995 | Broseghini et al. |
| 5,444,716 A | 8/1995 | Jarwala et al. |
| 5,446,683 A | 8/1995 | Mullen et al. |
| 5,450,414 A | 9/1995 | Lin |
| 5,524,114 A | 6/1996 | Peng |
| 5,533,128 A | 7/1996 | Vobach |
| 5,553,082 A | 9/1996 | Connor et al. |
| 5,574,733 A | 11/1996 | Kim |
| 5,586,125 A | 12/1996 | Warner |
| 5,588,006 A | 12/1996 | Nozuyama |
| 5,592,493 A | 1/1997 | Crouch et al. |
| 5,608,870 A | 3/1997 | Valiant |
| 5,612,963 A | 3/1997 | Koenemann et al. |
| 5,614,838 A | 3/1997 | Jaber et al. |
| 5,617,531 A | 4/1997 | Crouch et al. |
| 5,631,913 A | 5/1997 | Maeda |
| 5,642,362 A | 6/1997 | Savir |
| 5,668,817 A | 9/1997 | Adham |
| 5,680,543 A | 10/1997 | Bhawmik |
| 5,694,401 A | 12/1997 | Gibson |
| 5,694,402 A | 12/1997 | Butler et al. |
| 5,701,308 A | 12/1997 | Attaway et al. |
| 5,701,309 A | 12/1997 | Gearhardt et al. |
| 5,717,701 A | 2/1998 | Angelotti et al. |
| 5,717,702 A | 2/1998 | Stokes et al. |
| 5,719,913 A | 2/1998 | Maeno |
| 5,748,497 A | 5/1998 | Scott et al. |
| 5,761,489 A | 6/1998 | Broseghini et al. |
| 5,790,562 A | 8/1998 | Murray et al. |
| 5,790,626 A | 8/1998 | Johnson et al. |
| 5,812,561 A | 9/1998 | Giles et al. |
| 5,831,992 A | 11/1998 | Wu |
| 5,848,198 A | 12/1998 | Penn |
| 5,867,507 A | 2/1999 | Beebe et al. |
| 5,870,476 A | 2/1999 | Fischer |
| 5,872,793 A | 2/1999 | Attaway et al. |
| 5,883,906 A | 3/1999 | Turnquist et al. |
| 5,899,961 A | 5/1999 | Sundermann |
| 5,905,986 A | 5/1999 | Rohrbaugh et al. |
| 5,938,784 A | 8/1999 | Kim |
| 5,968,194 A | 10/1999 | Wu et al. |
| 5,974,179 A | 10/1999 | Caklovic |
| 5,974,433 A | 10/1999 | Currie |
| 5,983,380 A | 11/1999 | Motika et al. |
| 5,991,898 A | 11/1999 | Rajski et al. |
| 5,991,909 A | 11/1999 | Rajski et al. |
| 6,006,349 A | 12/1999 | Fujisaki |
| 6,014,763 A | 1/2000 | Dhong et al. |
| 6,021,513 A | 2/2000 | Beebe et al. |
| 6,026,508 A | 2/2000 | Craft |
| 6,029,263 A | 2/2000 | Gibson |
| 6,041,429 A | 3/2000 | Koenemann |
| 6,055,658 A | 4/2000 | Jaber et al. |
| 6,061,818 A | 5/2000 | Touba et al. |
| 6,072,823 A | 6/2000 | Takakusaki |
| 6,100,716 A | 8/2000 | Adham et al. |
| 6,122,761 A | 9/2000 | Park |
| 6,141,669 A | 10/2000 | Carleton |
| 6,148,425 A | 11/2000 | Bhawmik et al. |
| 6,158,032 A | 12/2000 | Currier et al. |
| 6,178,532 B1 | 1/2001 | Pierce et al. |
| 6,181,164 B1 | 1/2001 | Miller |
| 6,199,182 B1 | 3/2001 | Whetsel |
| 6,240,432 B1 | 5/2001 | Chuang et al. |
| 6,256,759 B1 | 7/2001 | Bhawmik et al. |
| 6,256,760 B1 | 7/2001 | Carron et al. |
| 6,272,653 B1 | 8/2001 | Amstutz |
| 6,286,119 B1 | 9/2001 | Wu et al. |
| 6,300,885 B1 | 10/2001 | Davenport et al. |
| 6,308,291 B1 | 10/2001 | Kock et al. |
| 6,327,685 B1 | 12/2001 | Koprowski et al. |
| 6,327,687 B1 | 12/2001 | Rajski et al. |
| 6,330,681 B1 | 12/2001 | Cote et al. |
| 6,353,842 B1 | 3/2002 | Rajski et al. |
| 6,385,750 B1 | 5/2002 | Kapur et al. |
| 6,463,560 B1 | 10/2002 | Bhawmik et al. |
| 6,467,058 B1 | 10/2002 | Chakradhar et al. |
| 6,510,398 B1 | 1/2003 | Kundu et al. |
| 6,539,409 B2 | 3/2003 | Rajski et al. |
| 6,543,020 B2 | 4/2003 | Rajski et al. |
| 6,557,129 B1 | 4/2003 | Rajski et al. |
| 6,590,929 B1 | 7/2003 | Williams |
| 6,611,933 B1 | 8/2003 | Koenemann et al. |
| 6,618,826 B1 | 9/2003 | Chen et al. |
| 6,684,358 B1 | 1/2004 | Rajski et al. |
| 6,694,466 B1 | 2/2004 | Tsai et al. |
| 6,708,192 B2 | 3/2004 | Rajski et al. |
| 6,763,488 B2 | 7/2004 | Whetsel |
| 6,829,740 B2 | 12/2004 | Rajski et al. |
| 6,874,109 B1 | 3/2005 | Rajski et al. |
| 7,001,461 B2 | 2/2006 | Taniguchi et al. |
| 7,093,175 B2 | 8/2006 | Rajski et al. |
| 7,111,209 B2 | 9/2006 | Rajski et al. |
| 7,188,286 B2 | 3/2007 | Dervisoglu et al. |
| 7,197,681 B2 | 3/2007 | Dervisoglu et al. |
| 7,260,591 B2 | 8/2007 | Rajski et al. |
| 7,263,641 B2 | 8/2007 | Rajski et al. |
| 7,478,296 B2 | 1/2009 | Rajski et al. |
| 7,493,540 B1 | 2/2009 | Rajski et al. |
| 7,500,163 B2 | 3/2009 | Rajski et al. |
| 7,506,232 B2 | 3/2009 | Rajski et al. |
| 7,509,546 B2 | 3/2009 | Rajski et al. |
| 7,523,372 B2 | 4/2009 | Rajski et al. |
| 7,563,641 B2 | 7/2009 | Wang et al. |
| 7,653,851 B2 | 1/2010 | Rajski et al. |
| 2002/0112199 A1 | 8/2002 | Whetsel |
| 2002/0124217 A1 | 9/2002 | Hiraide et al. |
| 2003/0120988 A1 | 6/2003 | Rajski et al. |
| 2003/0131298 A1 | 7/2003 | Rajski et al. |
| 2004/0128599 A1 | 7/2004 | Rajski et al. |
| 2004/0172431 A1 | 9/2004 | Rajski et al. |
| 2005/0015688 A1 | 1/2005 | Rajski et al. |

2005/0097419 A1    5/2005    Rajski et al.

FOREIGN PATENT DOCUMENTS

| EP | 0 372 226 | 6/1990 |
|---|---|---|
| EP | 0 438 322 | 7/1991 |
| EP | 0 481 097 | 4/1992 |
| EP | 0 549 949 | 3/1998 |
| EP | 0 887 930 | 12/1998 |
| EP | 1 257 837 A0 | 11/2002 |
| EP | 1 257 837 | 7/2008 |
| JP | 63-286780 | 11/1988 |
| JP | 01-239486 | 9/1989 |
| JP | 03-2579 | 1/1991 |
| JP | 03-012573 | 1/1991 |
| JP | 4-236378 | 8/1992 |
| JP | 05-215816 | 8/1993 |
| JP | 05-249197 | 9/1993 |
| JP | 07-174822 | 7/1995 |
| JP | 07-198791 | 8/1995 |
| JP | 08-015382 | 1/1996 |
| JP | 9-130378 | 5/1997 |
| JP | 11-030646 | 2/1999 |
| JP | 11-153655 | 6/1999 |
| JP | 11-174126 | 7/1999 |
| JP | 11-264860 | 9/1999 |
| JP | 2003-515174 | 4/2003 |
| JP | 3699397 | 7/2005 |
| WO | WO 91/10182 | 7/1991 |
| WO | WO 01/38889 | 5/2001 |
| WO | WO 01/38890 | 5/2001 |
| WO | WO 01/38891 | 5/2001 |
| WO | WO 01/38955 | 5/2001 |
| WO | WO 01/38981 | 5/2001 |
| WO | WO 01/39254 | 5/2001 |

OTHER PUBLICATIONS

U.S. Appl. No. 09/619,988, filed Jul. 20, 2000, Rajski et al.
U.S. Appl. No. 09/620,021, filed Jul. 20, 2000, Rajski et al.
U.S. Appl. No. 09/620,023, filed Jul. 20, 2000, Rajski et al.
U.S. Appl. No. 09/713,662, filed Nov. 15, 2000, Rajski et al.
U.S. Appl. No. 09/713,664, filed Nov. 15, 2000, Rajski et al.
Aitken et al., "A Diagnosis Method Using Pseudo-Random Vectors Without Intermediate Signatures," *Proc. ICCAD*, pp. 574-577 (1989).
Bardell, "Design Considerations for Parallel Pseudorandom Pattern Generators", *Journal of Electronic Testing: Theory and Applications*, vol. 1, pp. 73-87 (1990).
Bardell et al., "Pseudorandom arrays for built-in tests," *IEEE Trans. on Computers*, vol. C-35, No. 7, pp. 653-658 (1986).
Bardell et al., "Pseudorandom Sequence Generators," in *Built in test for VLSI: Pseudorandom Techniques*, Chapter 3, pp. 61-88 (1987).
Bardell et al., "Test Response Compression Techniques," in *Built-In Test for VLSI Pseudorandom Techniques*, Chapter 4, pp. 89-108 (1987).
Bassett et al., "Low-Cost Testing of High-Density Logic Components," *IEEE Design & Test of Computers*, pp. 15-28 (Apr. 1990).
Benowitz et al., "An Advanced Fault Isolation System for Digital Logic," IEEE Trans. on Computers, vol. C-24, No. 5, pp. 489-497 (May 1975).
Bershteyn, "Calculation of Multiple Sets of Weights for Weighted Random Testing," *Proc. ITC*, pp. 1031-1040 (1993).
Bhattacharya et al., "Zero-Aliasing Space Compression using a Single Periodic Output and its Application to Testing of Embedded Cores," VLSI Design, 6 pp. (Jan. 2000).
Chakrabarty et al., "Optimal space compaction of test responses," *Proc. ITC*, pp. 834-843 (1995).
Chakrabarty et al., "Optimal Zero-Aliasing Space Compaction of Test Responses," *IEEE Trans. on Computers*, vol. 47, No. 11, pp. 1171-1187 (Nov. 1998).
Chakrabarty et al., "Test response compaction using multiplexed parity trees," *IEEE Transactions CAD of Integrated Circuits and Systems*, vol. CAD-15, No. 11, pp. 1399-1408 (1996).

Chakrabarty, "Zero-Aliasing Space Compaction Using Linear Compactors With Bounded Overhead," *IEEE Transactions on CAD of Integrated Circuits and Systems*, vol. 17, No. 5, pp. 452-457 (May 1998).
European Search Report dated Nov. 25, 2004, from European Application No. EP 00 97 8829.
European Communication dated Feb. 1, 2005, from European Application No. EP 00 97 8829.
European Communication dated Feb. 10, 2006, from European Application No. EP 00 97 8829.
European Communication under Rule 51(4) EPC dated Oct. 26, 2007, from European Application No. EP 00 97 8829.
European Decision to grant a European patent dated Jun. 12, 2008, from European Application No. EP 00 97 8829.
Frohwerk, "Signature analysis: a new digital field services method," *Hewlett-Packard Journal*, pp. 2-8 (May 1977).
Ghosh-Dastidar et al., "Fault Diagnosis in Scan-Based BIST Using Both Time and Space Information," *Proc. ITC*, pp. 95-102 (Sep. 1999).
Golomb, *Shift Register Sequences*, Holden Day, San Francisco (1967).
Hamzaoglu et al., "Reducing Test Application Time for Full Scan Embedded Cores," *IEEE Proc. FTCS*, pp. 260-267 (1999).
Hayes, "Check sum test methods," *Proc. FTCS*, pp. 114-120 (1976).
Hayes, "Transition count testing of combinational logic circuits," *IEEE Transactions on Computers*, vol. C-25, No. 6, pp. 613-620 (1976).
Hellebrand et al., "Built-in Test for Circuits With Scan Based on Reseeding of Multiple Polynomial Linear Feedback Shift Registers," *IEEE Trans. On Computers*, vol. C-44, pp. 223-233 (Feb. 1995).
Hellebrand et al., "Generation of Vector Patterns Through Reseeding of Multiple-Polynomial Linear Feedback Shift Registers," *IEEE International Test Conference*, pp. 120-129 (1992).
Hellebrand et al., "Pattern Generation for a Deterministic BIST Scheme," *Proc. I-ICAD*, pp. 88-94 (1995).
Hetherington et al., "Logic BIST for Large Industrial Designs: Real Issues and Case Studies," *Proc. ITC*, pp. 358-367 (1999).
Ireland et al., "Matrix method to determine shift-register connections for delayed pseudorandom binary sequences," *Electronics Letters*, vol. 4 No. 15, pp. 309-310 (1968).
Ishida et al., "Compact: A hybrid method for compressing test data," *Proc. VLSI Test Symposium*, pp. 62-69 (1998).
Ivanov et al., "Programmable BIST space compactors," *IEEE Transactions on Computers*, vol. C-45, No. 12, pp. 1393-1404 (1996).
Iyengar et al., "Built-In Self-testing of sequential circuits using precomputed test sets," *Proc. VLSI Test Symposium*, pp. 418-423 (1998).
Japanese Notice of Grounds for Rejection dated Jun. 15, 2004 from Japanese Application No. 2001-540388.
Jas et al., "Test vector decompression via cyclical scan chains and its application to testing core-based designs," *Proc. ITC*, pp. 458-464 (1998).
Jone et al., "Space compression method for built-in self testing of VLSI circuits," *Int. Journal of Computer Aided VLSI Design*, vol. 3, pp. 309-322 (1991).
Kapur et al., "Design of an efficient weighted random pattern generation system," *Proc. ITC.*, pp. 491-500 (1994).
Karpovsky et al., "Board-Level Diagnosis by Signature Analysis," *Proc. ITC*, pp. 47-53 (1988).
Karpovsky et al., "Design of Self-Diagnostic Boards by Multiple Signature Analysis," *IEEE Trans. on Computers*, vol. 42, No. 9, pp. 1035-1044 (Sep. 1993).
Kiln et al., "On using signature registers as pseudorandom pattern generators in built-in self-testing," *IEEE Trans. CAD of IC*, vol. CAD-7, No. 8, 1988, pp. 919-928.
Koenemann, c/o IBM Corp., B56/901, "LFSR-Coded Test Patterns for Scan Designs," *Proc. European Test Conference*, pp. 237-242 (1991).
Konemann et al., "Built-In Logic Block Observation Techniques," *IEEE Test Conference*, 6 pp. (1979).
Kundu, "On Diagnosis of Faults in a Scan-Chain," *Proc. VLSI Test Symp.*, pp. 303-308 (1993).

Langdon, Jr., "An Introduction to Arithmetic Coding," *IBM J. Res. Develop.*, vol. 28, No. 2, pp. 135-149 (Mar. 1984).

Latawiec, "New method of generation of shifted linear pseudorandom binary sequences," *Proc. IEE*, vol. 121, No. 8, pp. 905-906 (1974).

Lew Yan Voon et al., "BIST Linear Generator based on Complemented Outputs," *IEEE VLSI Test Symp.*, pp. 137-142 (1992).

Li et al., "Space compression methods with output data modification," *IEEE Trans. CAD if Integrated Circuits and Systems*, vol. CAD-6, No. 2, pp. 290-294 (1987).

Mano, "Decoders and Multiplexers," in *Computer System Architecture*, Chapter 2, pp. 50-52 (1982).

Mrugalski et al., "Synthesis of pattern generators based on cellular automata with phase shifters," *Proc. ITC*, pp. 368-377 (1999).

Muradali et al., "A new procedure for weighted random built-in self-test," *Proc. ITC.*, pp. 600-669 (1990).

Narayanan et al., "An Efficient Scheme to Diagnose Scan Chains," *Proc. ITC*, pp. 704-713 (1997).

Pateras et al., "Cube-contained random patterns and their application to the complete testing of synthesized multi-level circuits," *Proc. ITC.*, pp. 473-482 (1991).

Pouya et al., "Synthesis of zero-aliasing elementary-tree space compactors," *Proc. VLSI Test Symp.*, pp. 70-77 (1998).

Rajski et al., "Accumulator-based compaction of test responses," *IEEE Trans. on Computers*, vol. C-42, No. 6, pp. 643-650 (1993).

Rajski et al., Chapter 3, "Test Response Compaction," and Chapter 4, "Fault Diagnosis," in *Arithmetic Built-In Self-Test for Embedded Systems*, pp. 87-133 (1998).

Rajski et al., "Automated Synthesis of Large Phase Shifters for Built-In Self-Test," *Proc. ITC*, Paper 41.1, pp. 1047-1056, (1998).

Rajski et al., "Decompression of Test Data Using Variable-Length Seed LFSRs," *Proc. VLSI Test Symp.*, pp. 426-433, (1995).

Rajski et al., "Design of Phase Shifters for BIST Applications," *Proc. VLSI Test Symp.*, pp. 218-224 (1998).

Rajski et al., "Diagnosis of Scan Cells in BIST Environment," *IEEE Trans. on Computers*, vol. 48, No. 7, pp. 724-731 (Jul. 1999).

Rajski et al., "Test Data Decompression for Multiple Scan Designs with Boundary Scan," *IEEE Trans. on Computers*, vol. 47, No. 11, pp. 1188-1200 (Nov. 1998).

Rajski et al., "Test responses compaction in accumulators with rotate carry adders," *IEEE Trans. CAD of Integrated Circuits and Systems*, vol. CAD-12, No. 4, pp. 531-539 (1993).

Reddy et al., "A Data compression technique for built-in self-test," *IEEE Trans. on Computers*, vol. C-37, pp. 1151-1156 (1988).

Saluja et al., "Testing Computer Hardware through Data Compression in Space and Time," *Proc. ITC*, pp. 83-88 (1983).

Savir, "Syndrome-testable design of combinational circuits," *IEEE Trans. on Computers*, vol. C-29, No. 6, pp. 442-451 (1980).

Saxena et al., "Accumulator compression testing," *IEEE Trans. on Computers*, vol. C-35, No. 4, pp. 317-321 (1986).

Saxena et al., "Analysis of checksums, extended-precision checksums, and cyclic redundancy," *IEEE Trans. on Computers*, vol. C-39, No. 7, pp. 969-975, 1990.

Saxena et al., "Extended precision checksums," *Proc. FTCS*, pp. 142-147 (1987).

Serra et al., "The analysis of one-dimensional linear cellular automata and their aliasing properties," *IEEE Trans. CAD of Integrated Circuits and Systems*, vol. CAD-9, No. 7, pp. 767-778 (1990).

Smith, "Measures of the effectiveness of fault signature analysis," *IEEE Trans. on Computers*, vol. C-29, No. 6, pp. 510-514 (1980).

Touba et al., "Altering a pseudo-random bit sequence for scan-based BIST," *Proc. ITC*, pp. 167-175 (1996).

Touba et al., "Transformed pseudo-random patterns for BIST," *Proc. VLSI Test Symp.*, pp. 410-416 (1995).

Tsai et al., "STARBIST: Scan autocorrelated random pattern generation," *Proc. DAC*, pp. 472-477 (1997).

Venkataraman et al., "An Efficient BIST Scheme Based on Reseeding of Multiple Polynomial Linear Feedback Shift Registers," *IEEE*, pp. 572-577 (1993).

Waicukauski et al., "A method for generating weighted random test patterns," *IBM J. Res. Develop.*, vol. 33, No. 2, pp. 149-161 (Mar. 1989).

Wang, "BIST Using Pseudorandom Test Vectors and Signature Analysis," *IEEE Custom Integrated Circuits Conference*, pp. 1611-1618 (1998).

Williams et al., "Bounds and analysis of aliasing errors in linear-feedback shift registers," *IEEE Trans. CAD of Integrated Circuits and Systems*, vol. CAD-7, No. 1, pp. 75-83 (1988).

Wu et al., "Scan-Based BIST Fault Diagnosis," *IEEE Trans. CAD of Integrated Circuits and Systems*, vol. 18, No. 2, pp. 203-211 (Feb. 1999).

Wunderlich et al., "Bit-flipping BIST," *Proc. ICCAD*, pp. 337-343 (1996).

Wunderlich, "Multiple distribution for biased random test patterns," *Proc. ITC*, pp. 236-244 (1988).

Wunderlich, "On computing optimized input probabilities for random tests," *Proc. DAC*, pp. 392-398 (1987).

Yamaguchi et al., "An efficient method for compressing test data," *Proc. ITC*, pp. 191-199 (1997).

Yarmolik et al., "Generation and Application of Pseudorandom Sequences for Random Testing," J. Wiley & Sons, New York (1988).

Zacharia et al., "Decompression of Test Data Using Variable Length Seed LFSRs," *IEEE*, pp. 426-433 (1995).

Zacharia et al., "Two-Dimensional Test Data Decompressor for Multiple Scan Designs," *Proc. ITC*, pp. 186-194 (1996).

Chakrabarty et al., "Design of Built-In Test Generator Circuits Using Width Compression," IEEE Trans. on Computer-Aided Design of Integrated Circuits and Systems, vol. 17, No. 10, pp. 1044-1051 (Oct. 1998).

Chakrabarty et al., "Test Width Compression for Built-In Self Testing," Proc. ITC, pp. 328-337 (Nov. 1997).

Fagot et al., "On Calculating Efficient LFSR Seeds for Built-In Self Test," IEEE, pp. 7-14 (1999).

Jas et al., "Scan vector compression/decompression using statistical coding," Proc. VLSI Test Symposium, pp. 114-120 (1999).

International Preliminary Examination Report from International Application No. PCT/US00/31827, dated Sep. 19, 2002, 5 pages.

International Search Report from International Application No. PCT/US00/31827, dated Mar. 12, 2001, 4 pages.

Written Opinion from International Application No. PCT/US00/31827, dated Nov. 20, 2001, 5 pages.

\* cited by examiner

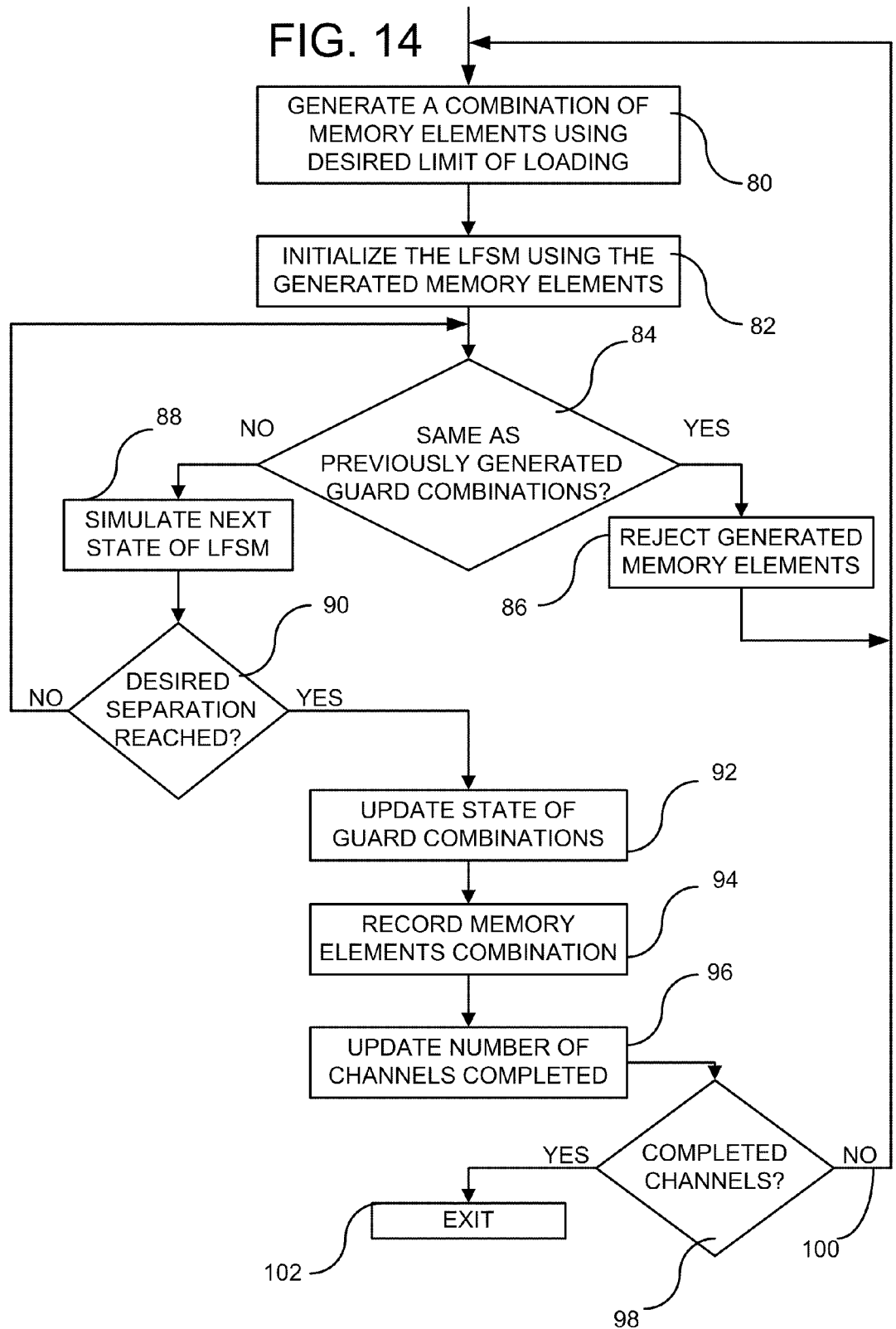

PHASE SHIFTER WITH REDUCED LINEAR DEPENDENCY

RELATED APPLICATION DATA

This application is a continuation of U.S. patent application Ser. No. 12/412,267, filed Mar. 26, 2009 now U.S. Pat. No. 7,653,851, which is a continuation of U.S. patent application Ser. No. 11/895,845, filed Aug. 27, 2007, now U.S. Pat. No. 7,523,372, which is a continuation of U.S. patent application Ser. No. 10/911,033, filed Aug. 3, 2004, now U.S. Pat. No. 7,263,641, which is a continuation of U.S. patent application Ser. No. 09/713,662, filed Nov. 15, 2000, now U.S. Pat. No. 6,874,109, which claims the benefit of U.S. Provisional Application No. 60/167,448, filed Nov. 23, 1999, all of which are hereby incorporated by reference.

TECHNICAL FIELD

This invention relates generally to generation of pseudo-random test vectors by means of linear feedback shift registers in multiple scan designs, and more particularly relates to means and methods for varying the phase shift and reducing linear dependency between test sequences occurring on the outputs of parallel test pattern generators.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements such as flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers, as shown in U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2-5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

FIG. 1 is a block diagram of a conventional system 10 for testing digital circuits with scan chains. External automatic testing equipment (ATE), or tester, 12 applies a set of fully specified test patterns 14 one by one to a CUT 16 in scan mode via scan chains 18 within the circuit. The circuit is then run in normal mode using the test pattern as input, and the test response to the test pattern is stored in the scan chains. With the circuit again in scan mode, the response is then routed to the tester 12, which compares the response with a fault-free reference response 20, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework as shown in FIG. 2. In BIST, additional on-chip circuitry is included to generate test patterns, evaluate test responses, and control the test. For example, a pseudo-random pattern generator 21 is used to generate the test patterns, instead of having deterministic test patterns. Additionally, a multiple input signature register (MISR) 22 is used to generate and store a resulting signature from test responses. In conventional logic BIST, where pseudo-random patterns are used as test patterns, 95-96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. Very often the tester memory required to store the supplemental patterns in BIST exceeds 50% of the memory required in the deterministic approach described above. Another limitation of BIST is that other types of faults, such as transition or path delay faults, are not handled efficiently by pseudo-random patterns. Because of the complexity of the circuits and the limitations inherent in BIST, it is extremely difficult, if not impossible, to provide a set of test patterns that fully covers hard-to-test faults.

The pseudo-random pattern generator typically is a simple hardware structure called linear feedback shift registers (LFSRs). An LFSR comprises a sequence of chained data memory elements forming a shift register. A given LFSR of length n can be represented by its characteristic polynomial $h_n x^n + \ldots + h_1 x + h_0$, where the term $h_i x^i$ refers to the ith flip-flop of the register, such that, if $h_i = 1$, then there is a feedback tap taken from this flip-flop. When the proper tap connections are established in accordance with the given polynomial, the combined (added modulo 2) output of each stage is feedback to the first stage of the LFSR. Such an implementation is called type I LFSR or Fibonacci generator. An alternative implementation uses a shift register with XOR gates placed between the LFSR cells. It is called type II LFSR or Galois true divisor. A distinct feature of this configuration is that the output of the last stage of the LFSR is being fed back to those stages, which are indicated by the characteristic polynomial employed. A polynomial, which causes an n-bit LFSR to go through all possible $2^n-1$ nonzero states is called a primitive characteristic polynomial. A corresponding LFSR is often referred to as a maximum-length LFSR, while the resultant output sequence is termed a maximum-length sequence or m-sequence.

FIG. 3 shows an LFSR 24 used as a test generator to feed multiple scan chains 26 in parallel. A problem with this design is that the resultant fault coverage is often unsatisfactory due to structural dependencies introduced by the LFSR. Indeed, if the scan paths are fed directly from adjacent bits of the LFSR, then this very close proximity causes neighboring scan chains to contain test patterns that are highly correlated. This phenomenon can adversely affect fault coverage, as the patterns seen by the circuit under test (CUT) will not be pseudo-random.

To further reduce correlation between scan chains, a phase shifter 28 is inserted between the LFSR 24 and the scan chains 26 (See FIG. 4). A typical phase shifter 28 consists of exclusive- or (XOR) network employed to avoid shifted versions of the same data in various scan paths. Every scan chain is then driven by circuitry that corresponds to a linear combination of LFSR stage outputs. This circuitry generates a test sequence with the desired separation from other sequences by employing the "shift-and-add" property of m-sequences according to which the sum of any m-sequence and a cyclic shift of itself is another cyclic shift of this m-sequence. In practice, phaseshift circuits are designed according to different principles. In constant-phase shifters, an interchannel displacement for each scan path is specified prior to the actual synthesis process. The latter employs the transition matrix that describes the LFSR behavior to determine LFSR outputs realizing successive shifts. The basic deficiencies of this approach are necessity to perform matrix operations and complexity of the resultant phase shifter which may feature, even after a decomposition and factorization process, an unnecessarily large number of XOR gates, and large propagation delays. The large propagation delays are evident from the large number of XOR gates coupled to a single tap 30 on the LFSR. Such an excess loading increases capacitance resulting in slow signal propagation. Notably, other taps on the LFSR, such as tap 32, only has a single XOR gate coupled to its output. The discrepancy between loads on the taps of the LFSR increases linear dependency between the patterns stored in the scan chains.

In order to control the amount of hardware involved in the phase shifter design process, an alternative technique is given in U.S. Pat. No. 4,959,832. Rather than seeking linear combinations for each channel, it starts with a pre-specified phase shifter structure, and subsequently determines the resultant channel phaseshifts. Consequently, the separations between channels become variable, and complex calculations may be required to determine their actual values. In addition, the solutions presented in that patent limits the number of output channels to the number of LFSR stages. Unfortunately, the method used to design the variable-phase shifters is inherently ad hoc and becomes impractical for circuits with a large number of scan chains.

Recently, a new technique was presented in two papers: "Design of phase shifters for BIST applications," Proc. VLSI Test Symposium, 1998, and "Automated Synthesis of Large Phase Shifters for Built-in Self-Test," Proc. ITC, 1998. These papers disclose a concept of LFSR duality. In LFSR duality, given a type I LFSR, its dual LFSR (that is always of type II) can be obtained by reversing the direction of all feedback taps except the rightmost one. Similarly, given an LFSR of type II, a dual LFSR of type I can be derived by reversing all the feedback taps except the rightmost one. This method relates the logical states of dual LFSRs and architecture of a desired phase shifter as follows. After an appropriate initialization of the dual LFSR, its logic simulation is performed for k consecutive steps. Subsequently, the resulting content of the dual LFSR, i.e., the locations of 1s, point out positions that should be included in a phase shifter structure to obtain a sequence shifted by k bits. It is shown that it is possible to synthesize in a time-efficient manner very large and fast phase shifters with guaranteed minimum phaseshifts between scan chains, and very low delay and area of virtually one 2-way XOR gate per output channel. Unfortunately, the techniques described in these papers also have problems with load balancing. Specifically, a discrepancy exists between loads on the LFSR taps that increases propagation delays and the linear dependency between the patterns stored in the scan chains.

The continuous trend toward higher integration densities and more flexible BIST automation tools creates an increasing need for more time-efficient phase shifter synthesis procedures and corresponding very fast logic synthesis routines. These techniques should be able to handle a wide variety of large LFSRs feeding a large number of scan chains, and, at the same time, provide a cost effective implementation of a given phase shifter network. It is not uncommon for the current designs to contain in excess of one million gates. The number of flip-flops in such designs ranges in tens of thousands. Assuming that there are about 50,000 flip-flops in a million gate design and limiting the number of flip-flops per scan chain to 250 in order to reduce the test application time, one can obtain a circuit with 200 scan chains. A 64-bit wide LFSR would be sufficient to drive these 200 scan chains only if a carefully designed phase shifter were employed to remove structural and linear dependencies. In order to ensure high fault coverage and reasonable test application time, it is imperative to eliminate such dependencies between the scan chains. From this example, it is clear that proper design of phase shifter circuits plays a key role in the success of a pseudo-random BIST scheme.

SUMMARY

The present invention provides a linear finite state machine (LFSM) and phase-shifter combination that loads scan chains with test patterns having reduced linear dependency. The LFSM includes multiple stages of memory elements (also called LFSM cells) typically coupled together in series and often having some intermediate feedback. The LFSM stages have outputs coupled to linear logic gates (e.g., XOR, XNOR gates) of the phase shifter. The output channels of the phase shifter are coupled to scan chains that are loaded with test patterns to test faults within the integrated circuit.

In one aspect, the LFSM has a substantially balanced load, meaning that the individual cell outputs (called taps) of the LFSM drive (roughly) a similar number of linear logic gates in the phase shifter. By having a balanced load, a plurality of linear logic gates in the phase shifter each receives its inputs from distinct cells of the LFSM. The LFSM cell outputs driving the phase shifter are selected by means of a pseudorandom number generator yielding uniformly distributed integers between 0 and n−1, where n is the size of the LFSM. Additionally, the generation process is guided by a histogram of the LFSM cells. Given an LFSM cell, the corresponding entry of the histogram records how often the cell has been used. If the current number of times a cell has been used exceeds a certain limit, that particular cell is temporarily excluded from further generation until the remaining cells have been used a similar number of times. As a result, the LFSM cells drive approximately the same number of phase shifter gates.

In another aspect, a verification phase ensures that a test pattern or sequence produced by a linear combination of newly generated taps does not overlap with sequences that are generated by already existing tap combinations. Thus, a check is performed for whether a given tap combination satisfies an interchannel separation criterion. That is, each of the resulting patterns must be shifted with respect to other patterns in the scan chains by at least a pre-specified number of bits. The interchannel separation may vary based on the application. For example, the interchannel separation may be at least the length of the longest scan chain.

In another aspect, a concept of duality is used to relate the logical states of LFSMs and architecture of circuits spacing their inputs to each of the outputs. Consequently, only simple logic simulation of a dual LFSM is required to determine if during a given period no elements are produced that belong to another sequence generated by a linear combination of taps already included into a phase shifter network.

The present invention may be practiced using LFSMs exhibiting properties of characteristic polynomials that produce maximum-length sequences.

These and other aspects and features of the invention are described below with reference to the accompanying drawings.

BRIEF DESCRIPTION OF THE DRAWINGS

FIG. 14 is a detailed flowchart of a method for generating a phase shifter.

DETAILED DESCRIPTION

Figure 1:
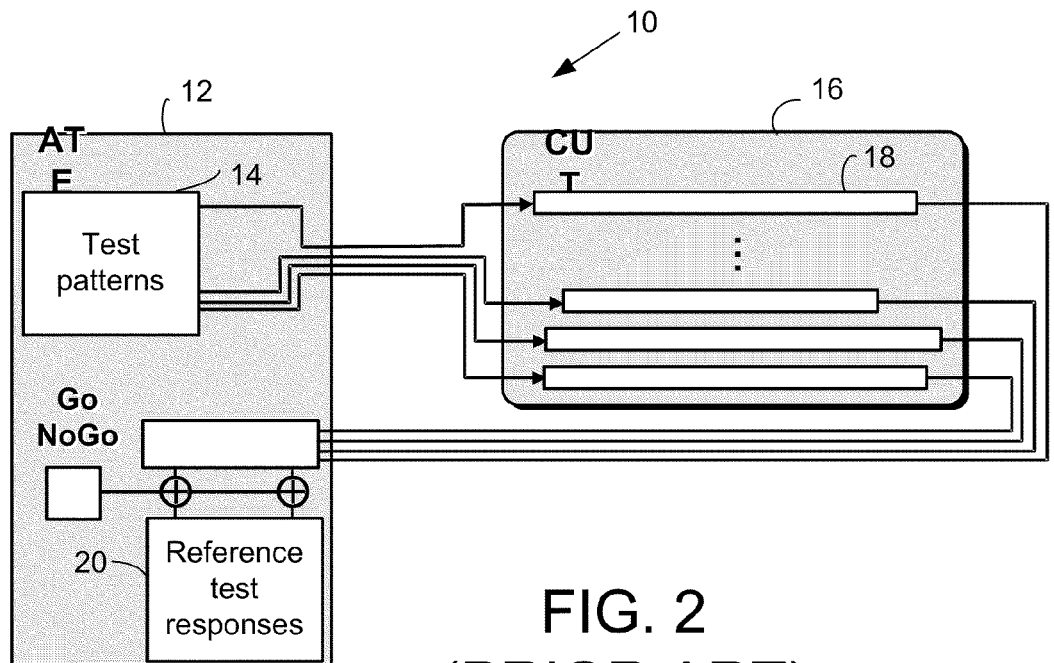
FIG. 1 is a block diagram of a prior art system for testing integrated circuits.
Figure 2:
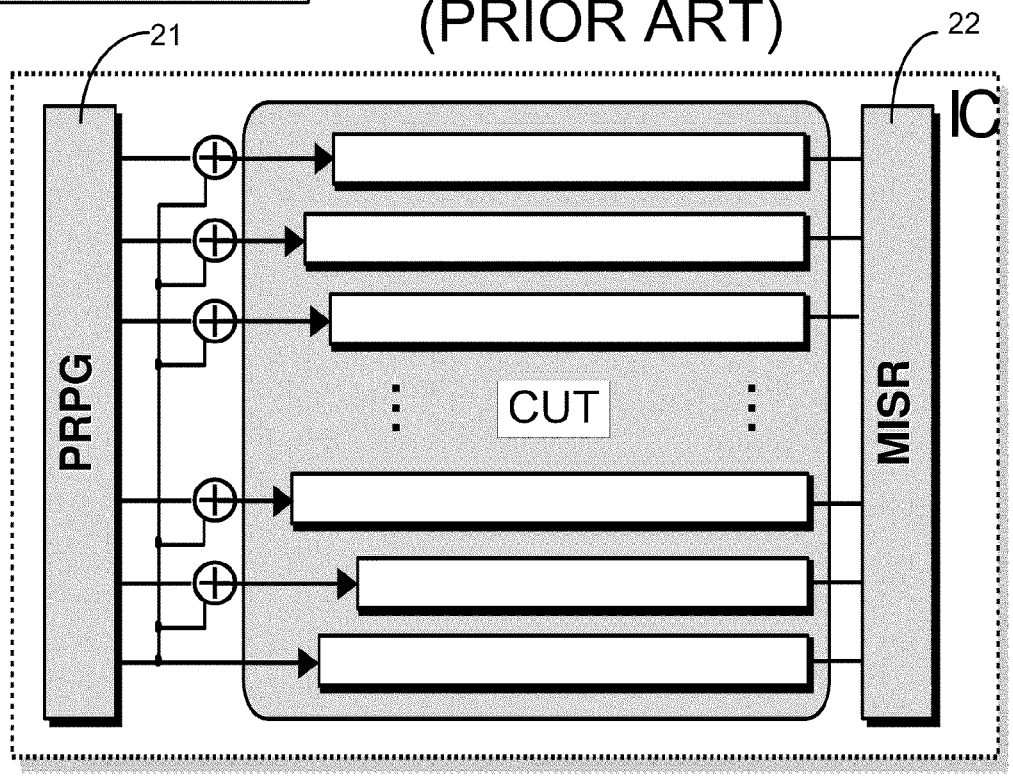
FIG. 2 is a block diagram of a prior art system using a built-in-test system.
Figure 3:
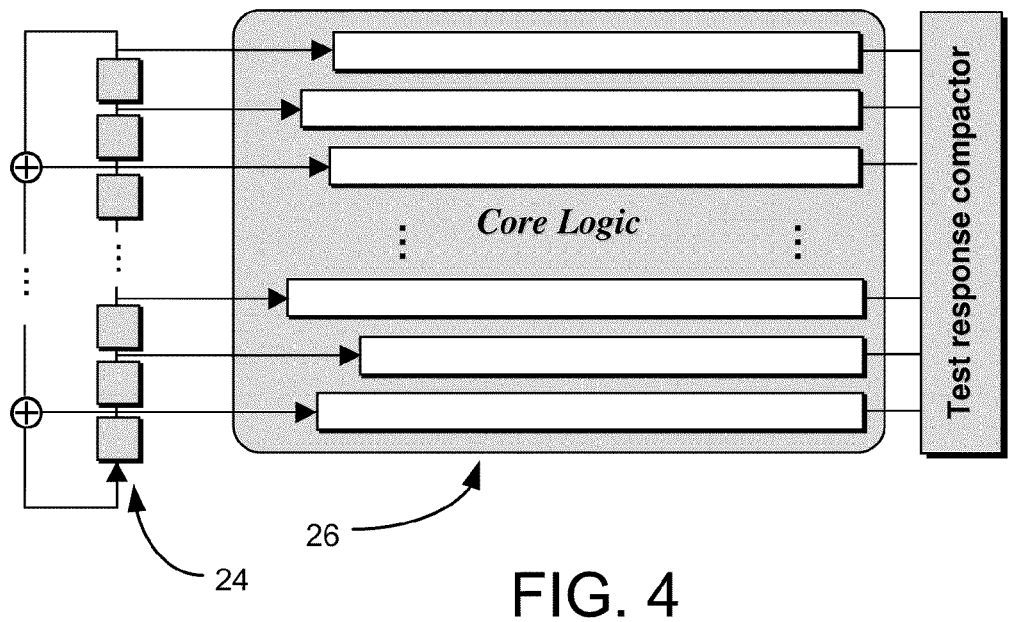
FIG. 3 is a circuit diagram of a prior art system having an LFSR feeding parallel scan chains.
Figure 4:
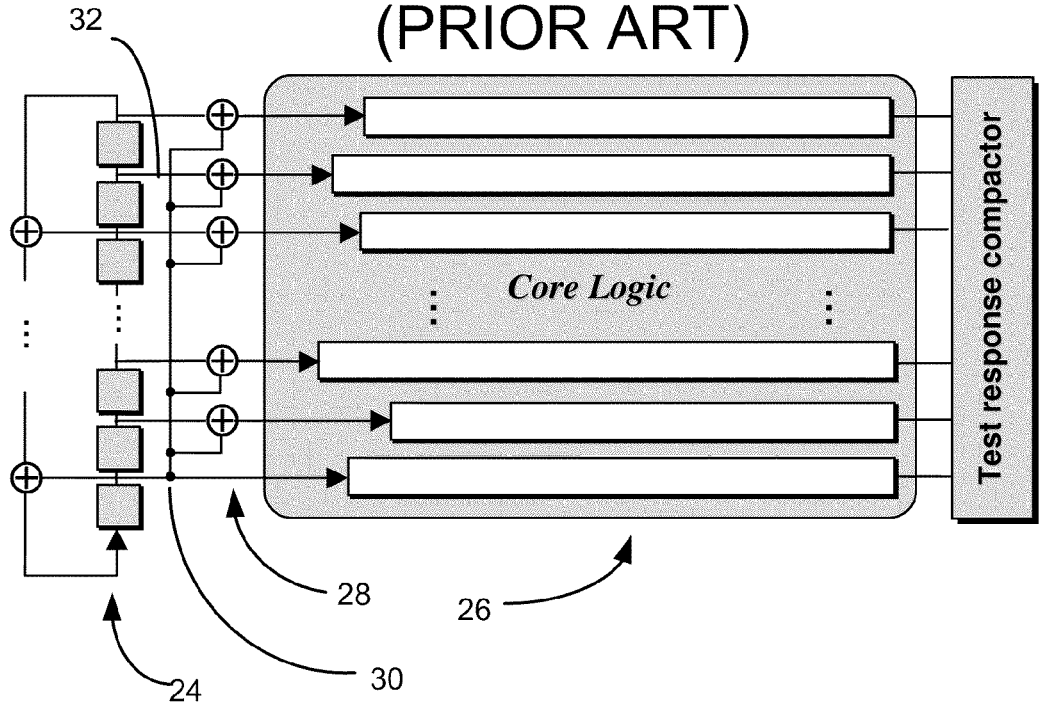
FIG. 4 is a circuit diagram of a prior art system having an LFSR feeding parallel scan chains through a phase shifter.
Figure 5:
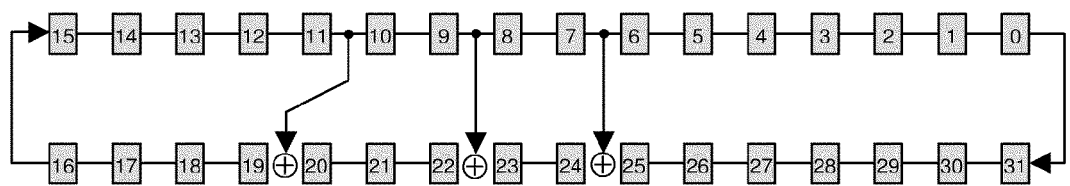
FIG. 5 is a circuit diagram of a transformed LFSR implementing polynomial $x^{32}+x^{18}+x^{14}+x^9+1$.

Linear finite state machines (LFSMs), such as linear feedback shift registers (LFSRs) and cellular automata (CA), are often used for generating pseudo-random sequences. An example LFSM implements a characteristic primitive polynomial $h(x)=h_n x^n + \ldots + h_1 x + h_0$ of degree n. Given this circuit, logic synthesis of phase shifters entails finding a set of linear combinations of the LFSM cell outputs such that each of the resulting sequences are shifted with respect to every other sequence by at least a pre-specified number of bits. Although a specific embodiment of the LFSM is described (i.e., a transformed LFSR), other LFSMs may be used. The transformed LFSR (also called the t-LFSR) includes memory elements in a ring structure with the feedback connections (in contrast to both type I and type II LFSRs) begin and terminate at different stages of the shift register, as shown in FIG. 5 for primitive polynomial $x^{32}+x^{18}+x^{14}+x^9+1$. For purposes of this description, the general form of LFSM shown if FIG. 5 is called a t-LFSR.

The method for synthesizing phase shifters shown and described herein is aimed at very fast selecting t-LFSR cells (the outputs of which are called taps) that when added produce m-sequences on successive output channels such that their mutual separations are not smaller than a pre-specified value. Successive tap combinations are generated randomly, and then a check is performed to determine if the generated combination can be accepted based on the interchannel separation criterion.

Figure 10:
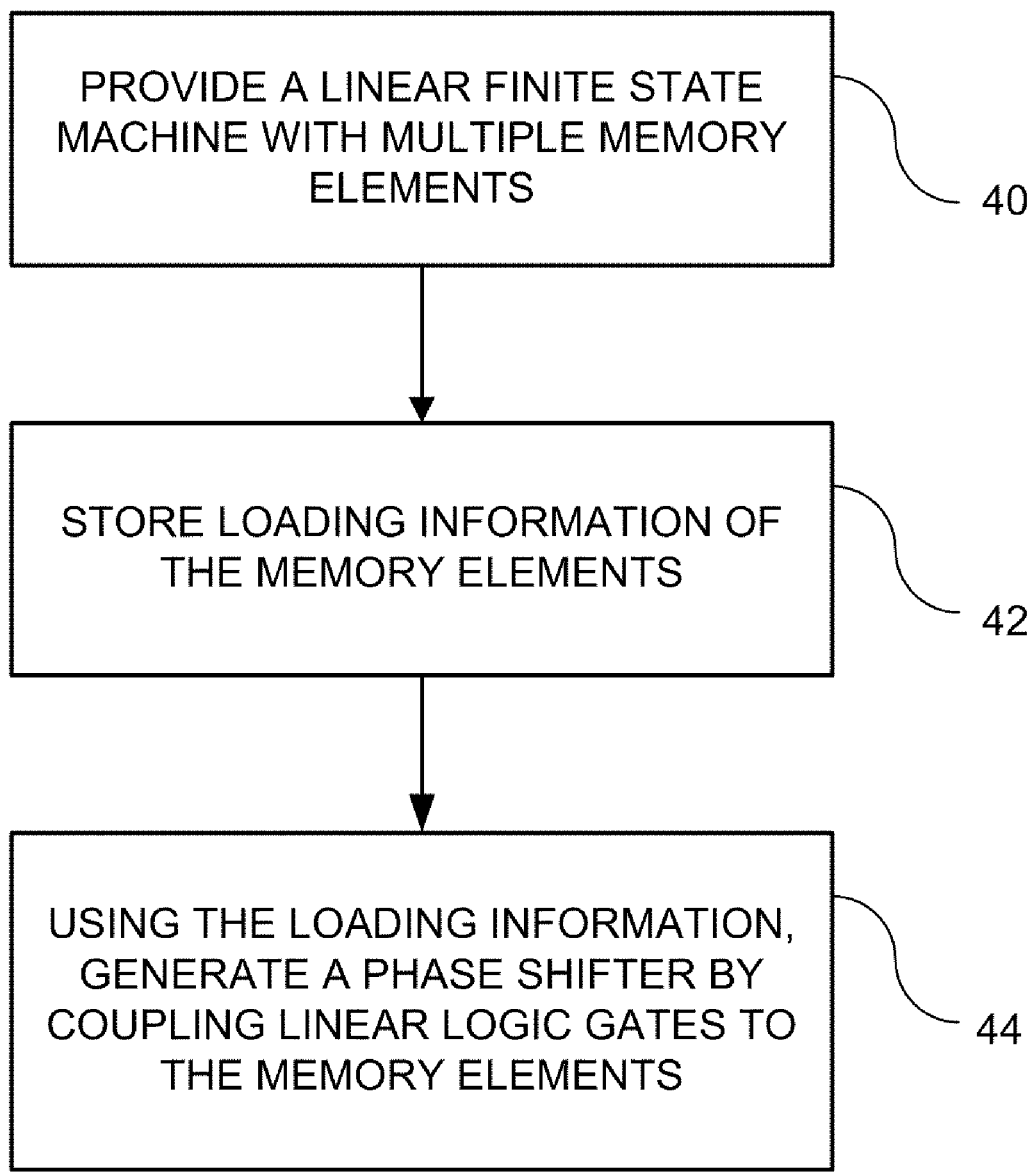
FIG. 10 is a flowchart of a method for generating a phase shifter with balanced loading.

FIG. 10 shows a flowchart of a method for generating a phase shifter. In process block 40, an LFSM includes multiple cells, which are memory elements (e.g., flip-flops). In process block 42, cell loads are stored for use during the generation process. The outputs of the cells are typically coupled to linear logic gates in the phase shifter. However, excess loading on the output of a memory element increases capacitance, slows the signal propagation, and slows the overall circuit. Additionally, larger memory elements may have to be used to accommodate for large fanouts. By storing the loading information, an analysis of the loading can be performed during generation of the phase shifter. In process block 44, a phase shifter is generated by using the loading information. One example of using the loading information is to distribute the loading across the memory elements. Thus, by distributing the loading across the memory elements, the overall speed of the circuit is increased.

Figure 11:
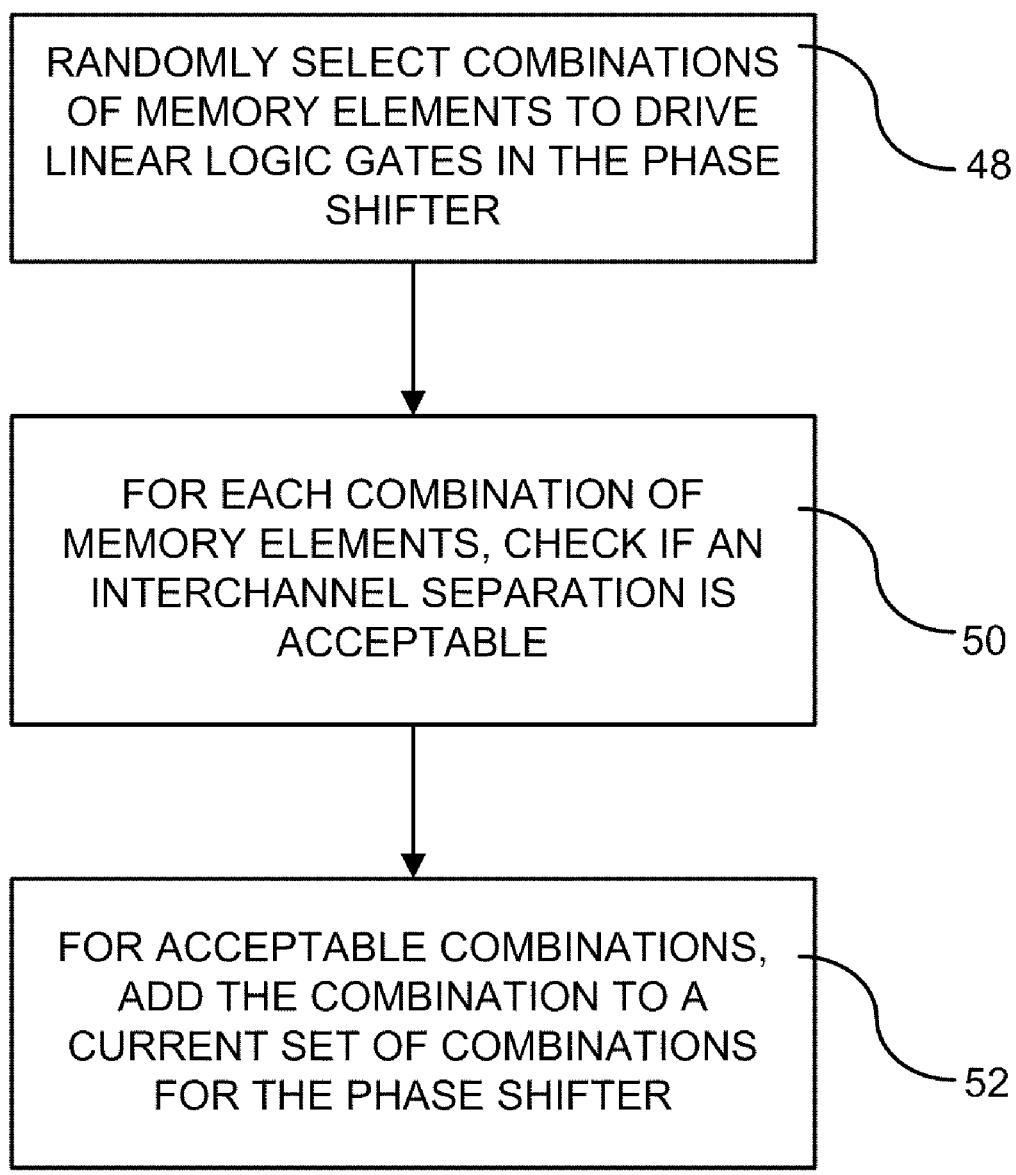
FIG. 11 is a flowchart of a method for generating a phase shifter using random generation of LFSM cells.

FIG. 11 is a more detailed flowchart of a method for generating a phase shifter having balanced loading. In process block 48, memory elements from the LFSM are randomly selected as candidates for use in driving a linear logic gate in the phase shifter. In process block 50, for each combination of randomly selected memory elements, a check is performed to determine if the interchannel separation is an acceptable limit. As described further below, to determine the interchannel separation, a simulation is performed on the LFSM to ensure that each of the resulting sequences are shifted with respect to every other sequence by at least a pre-specified number of bits. In process block 52, if the interchannel separation is adequate, the memory elements are added to the current list of acceptable combinations.

Figure 12:
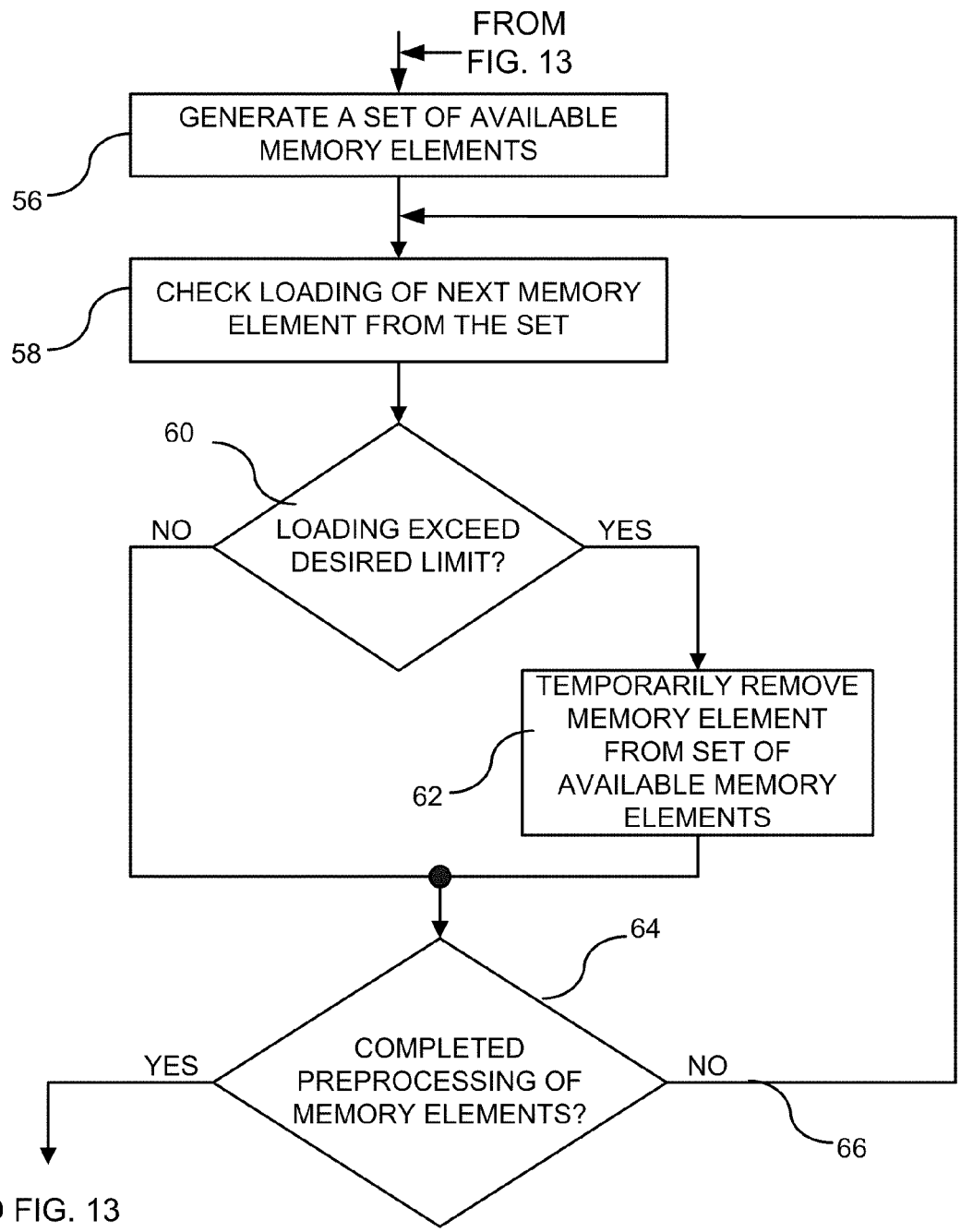
FIG. 12 is a flowchart of a method for preprocessing LFSM cells during generation.
Figure 13:
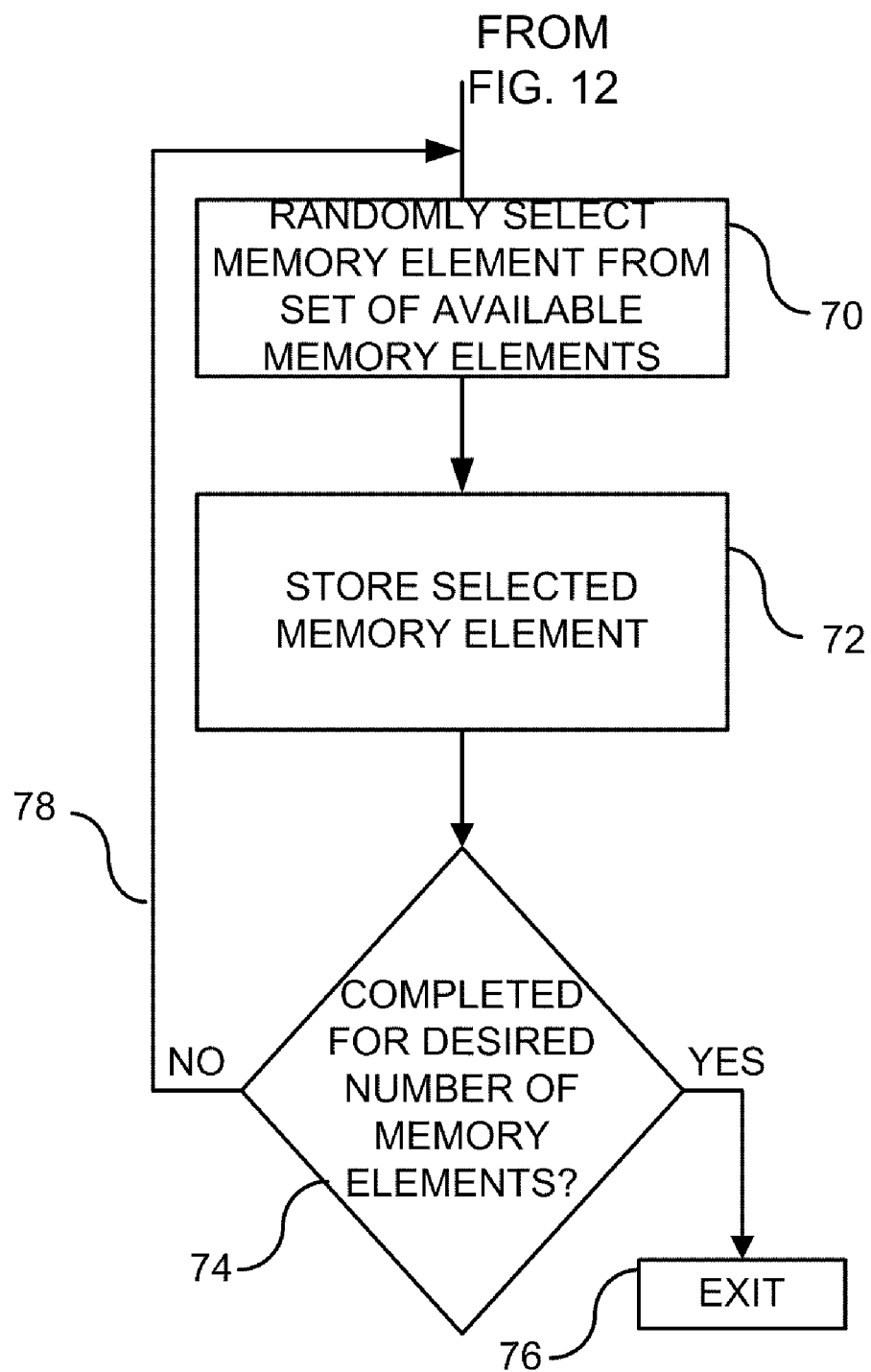
FIG. 13 is a flowchart for randomly selecting taps that have been preprocessed according to FIG. 12.

FIGS. 12 and 13 show the random generation of memory elements in more detail. FIG. 12 shows preprocessing performed on available memory elements. During the preprocessing, memory elements that have exceeded a desired limit on loading are temporarily excluded from a set of available elements. In process block 56, a set (table, array, list, etc.) of memory elements is generated. This set includes each of the memory elements in the LFSM that could potentially be used to drive a linear logic gate in the phase shifter. Each memory element is analyzed, in turn, to check for a current amount of loading on that memory element. Thus, in process block 58, a current memory element being analyzed has its loading checked. The loading of the memory elements changes during the generation process of the phase shifter. Consequently, a storage technique is used for keeping track of the amount of loading of the memory elements. The illustrated embodiment uses a histogram to track loading of the memory elements, but other techniques may be used. In decision block 60, a determination is made whether the loading on the currently analyzed memory element exceeds a desired limit. If decision block 60 is answered in the affirmative, the memory element is temporarily removed from the set of available memory elements (process block 62). If decision block 60 is answered in the negative, then the memory element remains in the set of available elements. In decision block 64, a check is made whether all of the memory elements in the set have been analyzed. If not, the process continues for other memory elements in the set as indicated by arrow 66. If decision block 64 is answered in the affirmative, processing continues in FIG. 13.

FIG. 13 shows the random selection of memory elements. In process block 70, a memory element is randomly selected. A variety of algorithms can be used for the random selection as is well understood in the art. In process block 72, the selected memory element is stored for later processing. In decision block 74, a check is made whether the desired number of memory elements has been selected. If not, the random selection continues, as indicated by arrow 78. If the desired number of memory elements have been selected, then the routine exits in block 76.

The following algorithm 1 shows specific details in the preprocessing and selection of memory elements. The algorithm uses as an example that the LFSM is a t-LFSR Algorithm 1 returns a desired combination assuming that auxiliary vectors Taps and Position it uses have dimensions equal to the requested number of XOR taps and the t-LFSR size, respectively. These vectors are employed to store successive XOR taps and to control the generation process.

---

ALGORITHM 1: RANDOM GENERATION OF XOR TAPS

Preprocessing ← true
while Preprocessing do
    for i ← 0 up to t-LFSR size − 1 do Position[i] = i
    k ← 0
    for i ← 0 up to t-LFSR size − 1 do
        if Histogram[i] = limit then
            Position[i] ← Position[k]
            k ← k + 1
    if t-LFSR size − k < desired number of XOR taps then limit ← limit + 1
    else Preprocessing ← false
// Actual generation of XOR taps
for i ← 0 up to desired number of XOR taps − 1 do
    r ← random (k, t-LFSR size − 1)
    Taps[i] ← Position[r]
    Position[r] ← Position[k]
    k ← k + 1

---

Algorithm 1 consists of two major parts. It starts by initializing vector Position. Through the course of the algorithm this vector maintains identities of all t-LFSR stages that have not been chosen yet. These numbers are gradually copied to those entries that were already selected and hence used as the XOR taps. Each entry Position[i] is set initially to i, for i=0, 1, . . . , n−1, where n is the size of a given t-LFSR. Then, still inside the while loop, the content of vector Position is further preprocessed as follows. To avoid large fanouts on the outputs of some t-LFSR stages, the generation process is guided by a histogram of the t-LFSR cell loads. Given a t-LFSR cell, the corresponding entry of the histogram records how often the cell has already been used. If the current value exceeds a certain limit, this particular cell is temporarily excluded from further generation until usage of the remaining cells will reach the similar level. In this way, all cells will drive virtually the same number of XOR taps.

A technique employed to accomplish exclusion of particular cells can be best understood when analyzing the second part of Algorithm 1 where actual XOR taps generation is carried out. Function random (a, b) is a generator of pseudo-random integers uniformly distributed in the range between a and b. Assuming that r is the required number of XOR taps, the algorithm fills in vector Taps in a manner that corresponds to producing r-element sequences chosen from an n-element set using random order. This part of Algorithm 1 needs exactly r steps to complete the generation process every time it is invoked. Indeed, successive XOR taps are provided through vector Position rather than directly from the generator random. Also, every generation step, the range in which function random operates, is getting reduced by one, thus assuring that even if the same random number is generated again, the entry indicated by this number will have a different content than before. The same technique used in the initialization phase precludes some t-LFSR cells from being overused.

For purposes of example, assume that initially the variable "limit" is equal to 1 and the Position vector is initialized as discussed earlier. Then execution of the above code reduces the range of candidate positions to become the next XOR taps combination to only those whose corresponding entries in vector Histogram are smaller than the current value of variable limit. Afterwards, the number of t-LFSR stages that has not been excluded is compared against the required number of XOR taps. If a new combination cannot be generated, the current limit is increased and the whole process repeats. Because some XOR taps combination can be rejected based on the interchannel separation criterion, even availability of several cells may not be a sufficient condition to successfully complete the generation process. Therefore, the number of such rejections must be recorded, and after a certain number of consecutive failures variable limit has to be increased as well.

For the sake of illustration, one and two-dimensional histograms of the loads of t-LFSR cells are included below. They were obtained when running Algorithm 1 on 24- and 32-bit t-LFSRs driving 100-output phase shifters. Each output channel of both phase shifters was supplied by a linear combination of seven t-LFSR stages. Thus expected loads of a single cell before logic synthesis are 30 and 22 XOR gates, respectively (compare the second rows of Tables I and II). Furthermore, every pair of t-LFSR cells was observed to measure how often this particular pair is involved in driving the same output channel of the phase shifter. Again, the expected numbers, assuming their orthogonality, were 7.61 and 4.23, respectively (see Tables III and IV). As can be seen, the resultant histograms represent highly balanced usage of all LFSR stages, with the generated numbers being very close to the theoretical ones. It should be noted, however, that the generation process of XOR taps is followed by logic synthesis in which the obtained XOR taps become the subject of factorization process. This procedure may significantly reduce the actual usage of successive stages of the generator as indicated by the third rows of Tables I and II, where the loads of generator stages after logic synthesis are listed.

TABLE I

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|----|----|----|----|----|----|----|----|----|----|----|----|----|----|
| 29 | 29 | 30 | 29 | 29 | 30 | 30 | 29 | 29 | 29 | 29 | 29 | 29 | 30 | 28 | 29 | 29 | 29 | 30 | 29 | 28 | 29 | 30 | 29 |
| 8 | 10 | 7 | 8 | 9 | 6 | 8 | 7 | 7 | 8 | 7 | 9 | 7 | 6 | 7 | 9 | 7 | 8 | 10 | 11 | 8 | 9 | 8 | 8 |

TABLE II

| 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|----|----|----|----|----|----|----|----|----|
| 22 | 22 | 22 | 22 | 22 | 21 | 22 | 22 | 22 | 22 | 22 | 22 | 22 | 22 | 2 | 22 | 22 | 22 | 21 |
| 8 | 9 | 8 | 7 | 7 | 7 | 9 | 8 | 9 | 7 | 9 | 7 | 8 | 7 | 8 | 8 | 8 | 10 | 9 |

| | 0 | 19 | 20 | 21 | 22 | 23 | 24 | 25 | 26 | 27 | 28 | 29 | 30 | 31 |
|---|---|----|----|----|----|----|----|----|----|----|----|----|----|----|
| | 22 | 21 | 22 | 22 | 22 | 22 | 22 | 22 | 21 | 22 | 22 | 22 | 22 | 22 |
| | 8 | 7 | 8 | 8 | 7 | 7 | 5 | 8 | 9 | 7 | 9 | 7 | 9 | 11 |

TABLE III

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|----|---|---|---|---|---|---|---|---|---|---|----|----|----|----|----|----|----|----|----|----|----|----|----|
| 1  | 7 |   |   |   |   |   |   |   |   |   |    |    |    |    |    |    |    |    |    |    |    |    |    |
| 2  | 9 | 6 |   |   |   |   |   |   |   |   |    |    |    |    |    |    |    |    |    |    |    |    |    |
| 3  | 9 | 6 | 8 |   |   |   |   |   |   |   |    |    |    |    |    |    |    |    |    |    |    |    |    |
| 4  | 7 | 5 | 10 | 11 |   |   |   |   |   |   |    |    |    |    |    |    |    |    |    |    |    |    |    |
| 5  | 5 | 5 | 11 | 7 | 11 |   |   |   |   |   |    |    |    |    |    |    |    |    |    |    |    |    |    |
| 6  | 9 | 10 | 7 | 5 | 6 | 11 |   |   |   |   |    |    |    |    |    |    |    |    |    |    |    |    |    |
| 7  | 4 | 11 | 7 | 4 | 5 | 10 | 8 |   |   |   |    |    |    |    |    |    |    |    |    |    |    |    |    |
| 8  | 6 | 9 | 5 | 10 | 8 | 8 | 9 | 11 |   |   |    |    |    |    |    |    |    |    |    |    |    |    |    |
| 9  | 7 | 9 | 5 | 5 | 6 | 7 | 9 | 8 | 5 |   |    |    |    |    |    |    |    |    |    |    |    |    |    |
| 10 | 10 | 7 | 12 | 9 | 11 | 7 | 3 | 8 | 9 | 7 |    |    |    |    |    |    |    |    |    |    |    |    |    |
| 11 | 9 | 8 | 7 | 14 | 10 | 7 | 4 | 6 | 8 | 9 | 9 |    |    |    |    |    |    |    |    |    |    |    |    |
| 12 | 10 | 3 | 6 | 8 | 13 | 12 | 7 | 6 | 6 | 5 | 6 | 8 |    |    |    |    |    |    |    |    |    |    |    |
| 13 | 7 | 7 | 9 | 7 | 4 | 7 | 10 | 4 | 8 | 11 | 7 | 3 | 5 |    |    |    |    |    |    |    |    |    |    |
| 14 | 4 | 11 | 7 | 8 | 4 | 9 | 5 | 13 | 14 | 7 | 9 | 10 | 7 | 4 |    |    |    |    |    |    |    |    |    |
| 15 | 5 | 8 | 9 | 9 | 7 | 11 | 9 | 10 | 7 | 3 | 5 | 9 | 9 | 8 | 8 |    |    |    |    |    |    |    |    |
| 16 | 6 | 8 | 9 | 6 | 7 | 6 | 13 | 6 | 6 | 9 | 5 | 4 | 7 | 10 | 5 | 10 |    |    |    |    |    |    |    |
| 17 | 7 | 7 | 7 | 8 | 6 | 11 | 11 | 9 | 6 | 9 | 6 | 7 | 6 | 8 | 10 | 6 | 7 |    |    |    |    |    |    |
| 18 | 8 | 6 | 11 | 9 | 8 | 7 | 7 | 7 | 5 | 9 | 10 | 9 | 5 | 11 | 3 | 6 | 10 | 9 |    |    |    |    |    |
| 19 | 10 | 8 | 6 | 5 | 3 | 6 | 5 | 10 | 9 | 11 | 4 | 7 | 12 | 9 | 8 | 7 | 9 | 8 | 7 |    |    |    |    |
| 20 | 6 | 9 | 5 | 4 | 8 | 6 | 5 | 6 | 8 | 9 | 8 | 7 | 9 | 14 | 8 | 3 | 3 | 8 | 10 | 9 |    |    |    |
| 21 | 12 | 5 | 8 | 9 | 9 | 7 | 7 | 8 | 7 | 8 | 9 | 8 | 8 | 5 | 8 | 6 | 8 | 7 | 7 | 7 | 5 |    |    |
| 22 | 9 | 10 | 11 | 7 | 8 | 5 | 11 | 6 | 4 | 6 | 6 | 6 | 7 | 13 | 2 | 11 | 11 | 4 | 8 | 8 | 9 | 6 |    |
| 23 | 8 | 9 | 5 | 6 | 7 | 4 | 9 | 7 | 6 | 10 | 7 | 5 | 9 | 9 | 4 | 8 | 9 | 7 | 8 | 6 | 9 | 10 | 12 |

TABLE IV

|    | 0 | 1 | 2 | 3 | 4 | 5 | 6 | 7 | 8 | 9 | 10 | 11 | 12 | 13 | 14 | 15 | 16 | 17 |
|----|---|---|---|---|---|---|---|---|---|---|----|----|----|----|----|----|----|----|
| 1  | 6 |   |   |   |   |   |   |   |   |   |    |    |    |    |    |    |    |    |
| 2  | 3 | 5 |   |   |   |   |   |   |   |   |    |    |    |    |    |    |    |    |
| 3  | 4 | 4 | 4 |   |   |   |   |   |   |   |    |    |    |    |    |    |    |    |
| 4  | 4 | 2 | 5 | 4 |   |   |   |   |   |   |    |    |    |    |    |    |    |    |
| 5  | 5 | 7 | 2 | 2 | 1 |   |   |   |   |   |    |    |    |    |    |    |    |    |
| 6  | 4 | 3 | 5 | 4 | 5 | 5 |   |   |   |   |    |    |    |    |    |    |    |    |
| 7  | 3 | 5 | 3 | 4 | 5 | 6 | 2 |   |   |   |    |    |    |    |    |    |    |    |
| 8  | 3 | 8 | 6 | 4 | 1 | 5 | 2 | 6 |   |   |    |    |    |    |    |    |    |    |
| 9  | 1 | 5 | 6 | 3 | 3 | 4 | 5 | 3 | 3 |   |    |    |    |    |    |    |    |    |
| 10 | 4 | 5 | 2 | 6 | 2 | 5 | 5 | 6 | 4 | 8 |    |    |    |    |    |    |    |    |
| 11 | 5 | 3 | 4 | 3 | 6 | 8 | 4 | 4 | 6 | 2 | 3 |    |    |    |    |    |    |    |
| 12 | 9 | 3 | 4 | 6 | 7 | 5 | 3 | 3 | 3 | 4 | 6 | 3 |    |    |    |    |    |    |
| 13 | 3 | 6 | 5 | 6 | 4 | 2 | 3 | 3 | 2 | 9 | 2 | 5 | 4 |    |    |    |    |    |
| 14 | 3 | 4 | 4 | 6 | 4 | 4 | 5 | 8 | 5 | 6 | 3 | 4 | 4 | 6 |    |    |    |    |
| 15 | 3 | 4 | 4 | 6 | 5 | 3 | 5 | 8 | 2 | 5 | 3 | 5 | 4 | 7 | 4 |    |    |    |
| 16 | 6 | 4 | 4 | 4 | 3 | 5 | 4 | 2 | 3 | 3 | 2 | 2 | 4 | 3 | 6 | 5 |    |    |
| 17 | 5 | 4 | 5 | 6 | 8 | 1 | 6 | 7 | 3 | 2 | 2 | 4 | 2 | 5 | 4 | 6 | 7 |    |
| 18 | 6 | 4 | 4 | 5 | 5 | 3 | 1 | 5 | 5 | 1 | 1 | 5 | 6 | 8 | 4 | 6 | 4 | 2 |
| 19 | 7 | 5 | 6 | 1 | 3 | 3 | 3 | 3 | 5 | 4 | 4 | 7 | 1 | 3 | 3 | 3 | 3 |   |
| 20 | 4 | 5 | 4 | 2 | 4 | 5 | 4 | 4 | 3 | 5 | 4 | 1 | 2 | 6 | 4 | 5 | 2 | 5 |
| 21 | 2 | 5 | 5 | 3 | 2 | 3 | 8 | 2 | 6 | 6 | 5 | 5 | 2 | 5 | 4 | 1 | 5 | 3 |
| 22 | 6 | 4 | 4 | 2 | 5 | 4 | 4 | 3 | 7 | 3 | 2 | 7 | 2 | 4 | 2 | 7 | 10 | 3 |
| 23 | 5 | 3 | 6 | 5 | 3 | 7 | 4 | 3 | 5 | 6 | 6 | 8 | 7 | 5 | 4 | 2 | 3 | 4 |

TABLE IV-continued

| | | | | | | | | | | | | | | | | | | |
|---|---|---|---|---|---|---|---|---|---|---|---|---|---|---|---|---|---|---|
| 24 | 4 | 7 | 4 | 3 | 1 | 6 | 4 | 2 | 5 | 5 | 4 | 1 | 3 | 4 | 5 | 6 | 6 | 4 |
| 25 | 7 | 4 | 4 | 3 | 8 | 2 | 3 | 6 | 5 | 5 | 6 | 6 | 2 | 3 | 3 | 3 | 5 | 6 |
| 26 | 4 | 4 | 7 | 5 | 2 | 3 | 5 | 2 | 6 | 5 | 6 | 5 | 5 | 4 | 4 | 3 | 6 | 4 |
| 27 | 4 | 1 | 3 | 5 | 8 | 1 | 6 | 4 | 2 | 5 | 4 | 4 | 5 | 4 | 9 | 4 | 5 | 4 |
| 28 | 1 | 6 | 6 | 4 | 4 | 4 | 5 | 8 | 6 | 3 | 4 | 3 | 4 | 2 | 3 | 3 | 5 | 4 |
| 29 | 6 | 4 | 2 | 8 | 7 | 5 | 5 | 2 | 3 | 1 | 4 | 4 | 5 | 3 | 0 | 3 | 6 | 6 |
| 30 | 3 | 0 | 1 | 5 | 5 | 3 | 4 | 4 | 3 | 6 | 6 | 3 | 4 | 5 | 5 | 4 | 4 | 4 |
| 31 | 2 | 2 | 5 | 5 | 5 | 5 | 6 | 6 | 5 | 5 | 8 | 5 | 4 | 3 | 2 | 3 | 1 | 3 |

| | 18 | 19 | 20 | 21 | 22 | 23 | 24 | 25 | 26 | 27 | 28 | 29 | 30 |
|---|---|---|---|---|---|---|---|---|---|---|---|---|---|
| 1 | | | | | | | | | | | | | |
| 2 | | | | | | | | | | | | | |
| 3 | | | | | | | | | | | | | |
| 4 | | | | | | | | | | | | | |
| 5 | | | | | | | | | | | | | |
| 6 | | | | | | | | | | | | | |
| 7 | | | | | | | | | | | | | |
| 8 | | | | | | | | | | | | | |
| 9 | | | | | | | | | | | | | |
| 10 | | | | | | | | | | | | | |
| 11 | | | | | | | | | | | | | |
| 12 | | | | | | | | | | | | | |
| 13 | | | | | | | | | | | | | |
| 14 | | | | | | | | | | | | | |
| 15 | | | | | | | | | | | | | |
| 16 | | | | | | | | | | | | | |
| 17 | | | | | | | | | | | | | |
| 18 | | | | | | | | | | | | | |
| 19 | 2 | | | | | | | | | | | | |
| 20 | 3 | 3 | | | | | | | | | | | |
| 21 | 2 | 2 | 6 | | | | | | | | | | |
| 22 | 9 | 4 | 3 | 4 | | | | | | | | | |
| 23 | 6 | 7 | 3 | 2 | 2 | | | | | | | | |
| 24 | 4 | 11 | 6 | 5 | 7 | 3 | | | | | | | |
| 25 | 2 | 3 | 7 | 3 | 6 | 2 | 1 | | | | | | |
| 26 | 2 | 6 | 2 | 7 | 3 | 3 | 4 | 3 | | | | | |
| 27 | 5 | 4 | 6 | 4 | 4 | 1 | 2 | 9 | 3 | | | | |
| 28 | 3 | 5 | 5 | 7 | 5 | 1 | 4 | 1 | 4 | 5 | | | |
| 29 | 4 | 3 | 8 | 5 | 3 | 6 | 5 | 6 | 1 | 4 | 4 | | |
| 30 | 6 | 3 | 7 | 5 | 2 | 6 | 5 | 4 | 5 | 3 | 3 | 5 | |
| 31 | 3 | 2 | 4 | 8 | 1 | 4 | 1 | 4 | 3 | 4 | 10 | 4 | 9 |

As can be seen in Tables I and II, there is load balancing between the memory elements of the LFSM. Additionally, there is load balancing for pairwise combinations of memory elements driving the same linear logic gate. For example, referring to Table III, XOR tap combination 01 is used seven times. This means seven linear logic gates in the phase shifter are driven by a combination of memory element 0 and memory element 1 in the LFSM. As can be seen, each pairwise combination of memory elements drives a substantially similar number of linear logic gates. Of course some variation exists in the load balancing and pairwise combinations, but compared to previous designs, these features are much improved.

The verification step is ideally carried out to ensure that, assuming the minimum channel separation d, a sequence produced by a linear combination of newly generated XOR taps does not overlap with sequences generated by already existing channels. In order to carry out the verification procedure, the new method is employed that generalizes the concept of duality.

Figure 6:
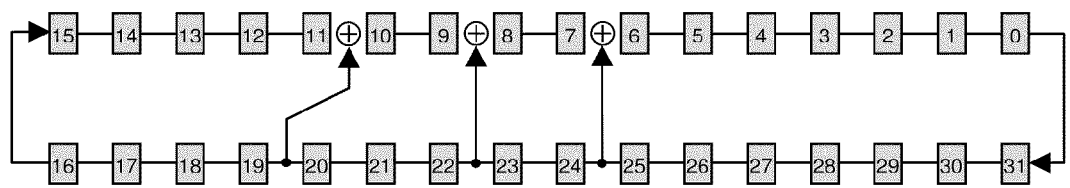
FIG. 6 is a circuit diagram of a dual transformed LFSR of the transformed LFSR of FIG. 5.

Given the original structure of the t-LFSR as shown in FIG. 5, its dual form is derived by reversing the direction of all feedback connections (see FIG. 6). In other words, a dual t-LFSR features XOR gates placed on the outputs of those flip-flops that have been used to drive feedback taps in the original circuit while the feedback lines originate now at the former locations of the respective XOR gates. The newly obtained dual t-LFSR is characterized by a corresponding transition matrix, say D. A detailed examination of the original t-LFSR transition matrix M and matrix D reveals a fundamental relationship between them which can be summarized by the following equation:

$$M^T = D^{-1},$$

where $M^T$ is the transpose of M and $D^{-1}$ is the inverse of D. If the above relationship is valid, then the product of $M^T$ (or equivalently $D^{-1}$) and D should be equal to the identity matrix I. It can be easily verified that matrix $M^T$ contains 1s along the diagonal below the main diagonal (plus an additional one in the corner to assure a ring structure of the feedback register), while matrix D features 1s along the diagonal above the main diagonal, and again an additional one to close the loop structure. These are the only entries that contribute to ones located on the main diagonal of the matrix $DD^{-1}$. When computing remaining entries of this product, in each case the result is zero. To see that this is so, consider an entry that occurs in row x and column y of the matrix $DD^{-1}$. The way it is computed requires that in order to have a nonzero result two ones must occur on the corresponding positions in row x and column y, respectively. Without loss of generality, we may assume that the nonzero entry from row x represents a connection between two consecutive flip-flops b−1 and b, i.e., it occurs on the diagonal below the main diagonal. The matching nonzero entry from the column y must correspond to a connection between flip-flops b−1 and another flip-flop c. The latter connection must have its own counterpart in the original circuit, that is, a feedback line connection between flip-flops c−1 and b represented by additional one in row x on position c−1. This one is, however, compensated by an entry in column y corresponding to connection between consecutive flip-flops c−1 and c. As can be seen, adding up the resulting two products yields the value of zero.

It is already known that it is possible to find a phase shifter for a given channel spaced q shifts down the m-sequence generated by the jth channel of the conventional LFSRs once a vector $M^q s_j^T$ is determined, where $s_j^T$ is a transpose of a selection vector that features a single one at the jth position.

The resulting vector will have a one at each position that has to be added to obtain the desired m-sequence shifted by q bits. It is known that if transition matrices of two shift registers satisfy the relationship $M^T = D^{-1}$, then the following result holds:

$$[M^q]^T = D^m.$$

where $m = 2^n - 1 - q$. From the above formula a remarkable property of the t-LFSR duality follows, namely that the contents of the first column of M after q multiplications will also be seen in the first row of D after $2^n - 1 - q$ multiplications of this matrix by itself. Since this row of D can be regarded as the state of the dual t-LFSR after applying $2^n - 1 - q$ clock cycles (provided its initial value was 10 . . . 0), matrix operations of the former techniques known from the art can be replaced with a simple logic simulation of dual t-LFSRs. In fact, simulation of the dual t-LFSR can be terminated after only q cycles. The state of the dual t-LFSR will then define which outputs of the original t-LFSR have to be XOR-ed to produce a desired string of bits that will be spaced q shifts up the reference m-sequence, i.e., the m-sequence originating from the designated stage of the t-LFSR.

Figure 7A:
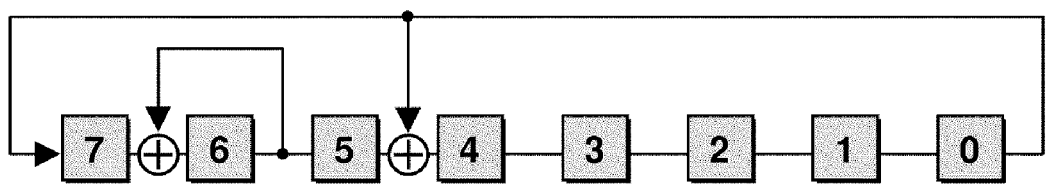
FIG. 7A is a circuit diagram of a transformed LFSR with minimized number of XOR gates and implementing primitive polynomial $x^8+x^6+x^5+x+1$.
Figure 7B:
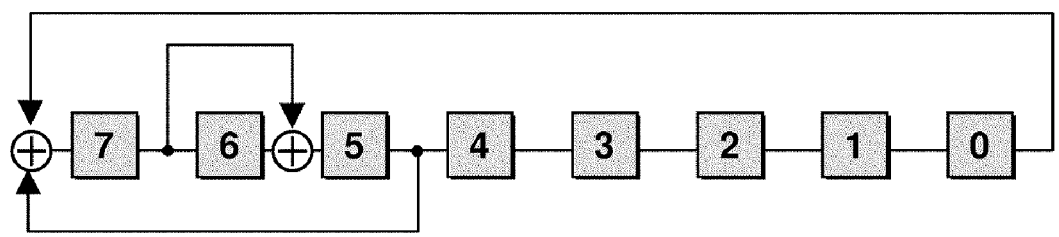
FIG. 7B is a circuit diagram of a dual transformed LFSR of the transformed LFSR of FIG. 7A.

As an example, consider a t-LFSR shown in FIG. 7A, which has been obtained by applying a number of m-sequence preserving transformations. The resulting t-LFSR still implements primitive characteristic polynomial $h(x) = x^8 + x^6 + x^5 + x + 1$. It has been, however, optimized in order to reduce the number of XOR gates, internal fan-outs and propagation delays. The second column of Table V shows the operation of this t-LFSR while successive states of its dual t-LFSR (FIG. 7B) are listed in the fourth column of the same table under the heading "States of the Dual t-LFSR". Some of the resulting m-sequences obtained by adding respective outputs of the original t-LFSR, as indicated by the states of its dual t-LFSR, are gathered in the third column of Table V. The resulting phaseshifts are shown in the header of this column. For instance, state 01100000 occurring in the row "1" indicates that in order to obtain the m-sequence shifted by one bit, function s2⊕s3 has to be implemented, where $s_i$ is the ith stage of the original t-LFSR. Similarly, state occurring in the row "7", i.e., combination 00010011 points out that if the fourth, seventh and eighth stages are added altogether (s4⊕s7⊕s8), then the resulting m-sequence will be shifted by 7 bits. It can be easily verified that all presented sequences are indeed shifted by the desired phaseshifts (shown in the header) with regard to the m-sequence observed on the leftmost bit of the original t-LFSR.

TABLE V

| States of original t-LFSR | | 1 | 2 | 3 | 4 | 5 | 6 | 7 | 8 | 9 | 10 | 11 | 12 | 13 | 14 | States of dual t-LFSR |
|---|---|---|---|---|---|---|---|---|---|---|---|---|---|---|---|---|
| | | | | | | | | m-sequences | | | | | | | | |
| 0 | 1 0 0 0 0 0 0 0 | 0 | 1 | 1 | 1 | 0 | 0 | 0 | 1 | 1 | 1 | 0 | 1 | 1 | 1 | 1 0 0 0 0 0 0 0 |
| 1 | 0 1 0 0 0 0 0 0 | 1 | 0 | 1 | 1 | 1 | 0 | 0 | 0 | 1 | 1 | 1 | 0 | 1 | 1 | 0 1 1 0 0 0 0 0 |
| 2 | 0 1 1 0 0 0 0 0 | 0 | 1 | 0 | 1 | 1 | 1 | 0 | 0 | 0 | 1 | 1 | 1 | 0 | 1 | 1 0 1 1 0 0 0 0 |
| 3 | 0 1 1 1 0 0 0 0 | 0 | 0 | 1 | 0 | 1 | 1 | 1 | 0 | 0 | 0 | 1 | 1 | 1 | 0 | 1 1 1 1 1 0 0 0 |
| 4 | 0 1 1 1 1 0 0 0 | 0 | 0 | 0 | 1 | 0 | 1 | 1 | 1 | 0 | 0 | 0 | 1 | 1 | 1 | 1 1 0 1 1 1 0 0 |
| 5 | 0 1 1 1 1 1 0 0 | 0 | 0 | 0 | 0 | 1 | 0 | 1 | 1 | 1 | 0 | 0 | 0 | 1 | 1 | 0 1 0 0 1 1 1 0 |
| 6 | 0 1 1 1 1 1 1 0 | 0 | 0 | 0 | 0 | 0 | 1 | 0 | 1 | 1 | 1 | 0 | 0 | 0 | 1 | 0 0 1 0 0 1 1 1 |
| 7 | 0 1 1 1 1 1 1 1 | 0 | 0 | 0 | 0 | 0 | 0 | 1 | 0 | 1 | 1 | 1 | 0 | 0 | 0 | 0 0 0 1 0 0 1 1 |
| 8 | 1 1 1 0 1 1 1 1 | 0 | 0 | 0 | 0 | 0 | 0 | 0 | 1 | 0 | 1 | 1 | 1 | 0 | 0 | 1 0 0 0 1 0 0 1 |
| 9 | 1 0 1 0 0 1 1 1 | 1 | 0 | 0 | 0 | 0 | 0 | 0 | 0 | 1 | 0 | 1 | 1 | 1 | 0 | 1 1 1 0 0 1 0 0 |
| 10 | 1 1 0 0 0 0 1 1 | 1 | 1 | 0 | 0 | 0 | 0 | 0 | 0 | 0 | 1 | 0 | 1 | 1 | 1 | 1 1 0 1 0 0 1 0 |
| 11 | 1 0 1 1 0 0 0 1 | 1 | 1 | 1 | 0 | 0 | 0 | 0 | 0 | 0 | 0 | 1 | 0 | 1 | 1 | 0 1 0 0 1 0 0 1 |
| 12 | 1 1 0 0 1 0 0 0 | 1 | 1 | 1 | 1 | 0 | 0 | 0 | 0 | 0 | 0 | 0 | 1 | 0 | 1 | 1 0 1 0 0 1 0 0 |
| 13 | 0 0 1 0 0 1 0 0 | 1 | 1 | 1 | 1 | 1 | 0 | 0 | 0 | 0 | 0 | 0 | 0 | 1 | 0 | 1 1 1 1 0 0 1 0 |
| 14 | 0 0 0 1 0 0 1 0 | 0 | 1 | 1 | 1 | 1 | 1 | 0 | 0 | 0 | 0 | 0 | 0 | 0 | 1 | 1 1 0 1 1 0 0 1 |
| 15 | 0 0 0 0 1 0 0 1 | 0 | 0 | 1 | 1 | 1 | 1 | 1 | 0 | 0 | 0 | 0 | 0 | 0 | 0 | 1 1 0 0 1 1 0 0 |
| 16 | 1 0 0 1 0 1 0 0 | 0 | 0 | 0 | 1 | 1 | 1 | 1 | 1 | 0 | 0 | 0 | 0 | 0 | 0 | 0 1 0 0 0 1 1 0 |
| 17 | 0 1 0 0 1 0 1 0 | 1 | 0 | 0 | 0 | 1 | 1 | 1 | 1 | 1 | 0 | 0 | 0 | 0 | 0 | 0 0 1 0 0 0 1 1 |
| 18 | 0 1 1 0 0 1 0 1 | 0 | 1 | 0 | 0 | 0 | 1 | 1 | 1 | 1 | 1 | 0 | 0 | 0 | 0 | 0 0 0 1 0 0 0 1 |
| 19 | 1 1 1 0 0 0 1 0 | 0 | 0 | 1 | 0 | 0 | 0 | 1 | 1 | 1 | 1 | 1 | 0 | 0 | 0 | 1 0 0 0 1 0 0 0 |

Although the simulation-based technique as shown above could be used alone to synthesize phase shifters, it is not time efficient when trying to maintain the XOR taps count low. This is because states of a given t-LFSR having a small number of ones (thus yielding simpler implementations) are relatively seldom in the m-sequences produced by large t-LFSRs. Consequently, a lot of states have to be scanned before accepting desired number of combinations that will guarantee the requested minimum separation. Nevertheless, this approach can be adopted to carry out the verification procedure. Note, that no overlap between already obtained sequences and a sequence produced by newly generated XOR taps implies that from a binary combination β representing the new XOR taps onwards, for at least next d steps, there is no beginning of another sequence generated by a linear combination of XOR taps already included into a phase shifter network. Similarly, no already selected combinations should occur among, at least, d successive states preceding state β in the state trajectory of the dual t-LFSR.

Let each XOR taps combination accepted in the previous generation steps be now represented by two binary vectors (called guard combinations): the actual XOR taps combination and another vector that is separated from the former one by d steps down the state trajectory of a given dual t-LFSR. Consequently, starting from the candidate XOR taps, every new combination obtained during logic simulation of the dual t-LFSR becomes the subject of searching for the same element in a dictionary of the guard combinations representing already accepted XOR taps. If found, it must be rejected as the m-sequence generated by the candidate XOR taps would overlap with other sequences generated by XOR taps already included into the phase shifter structure. Note that the second guard combination is always determined at the end of a particular verification step unless the XOR taps are rejected.

FIG. 14 shows a detailed flowchart of the overall method for generating a phase shifter. In process block 80, a combination of memory elements are generated (e.g., using the techniques described in relation to FIGS. 12 and 13). In process block 82, the LFSM is initialized using the generated memory elements. In decision block 84, a check is made whether the state of the LFSM is the same as previously generated guard combinations. If decision block 84 is answered in the affirmative, then the memory elements are rejected (process block 86) and the process starts over at process block 80. If decision block 84 is answered in the negative, then the next state of the LFSM is simulated (process block 88). For example, the simulated LFSM is clocked one cycle. After the LFSM is clocked, a check is made to determine if the desired separation is reached (process block 90). Specifically, a check is made to ensure that the resulting sequences are shifted with respect to every other sequence by at least a pre-specified number of bits. Many different criteria may be used for determining whether the channel separation is sufficient. For example, the channel separation may be at least the length of the longest scan chain. If the desired interchannel separation is not reached, then decision block 84 and process block 88 are repeated until the desired separation is reached or a repeating pattern occurs (which results in failure). If the desired separation is reached, the state of the guard combinations is updated (process block 92), the combination of memory elements are added to the interim version of the phase shifter (process block 94), and the number of channels completed is incremented (process block 96). In decision block 98, a check is made whether all the desired number of channels has been generated. If not, the overall process repeats (see arrow 100). If the desired number of channels is generated then the routine is complete (process block 102) and the phase shifter is generated. Logic synthesis can be used to further reduce the size of the generated phase shifter. Notably, a phase shifter having load balancing continues to have load balancing after logic synthesis.

An exemplary pseudo-code is shown below in Algorithm 2 for a t-LFSR. An assumption is made that a function already generated (vector) returns a logic value true if vector is on the list of guard combinations.

---

ALGORITHM 2: SYNTHESIS OF PHASE SHIFTERS

```
channels ← 0
while channels < requested outputs do
    generate XOR taps using Algorithm 1
    rejected ← false
    initialize dual t-LFSR using XOR taps combination
    i ← 0
    while i ≦ separation and not rejected do
        rejected ← already generated (state of dual t-LFSR)
        simulate dual t-LFRS for one clock cycle
        i ← i + 1
    if not rejected then
        insert XOR taps combination into the list of guard combinations
        insert state of dual t-LFSR into the list of guard combinations
        record XOR taps combination
        channels ← channels + 1
```

---

Figure 8:
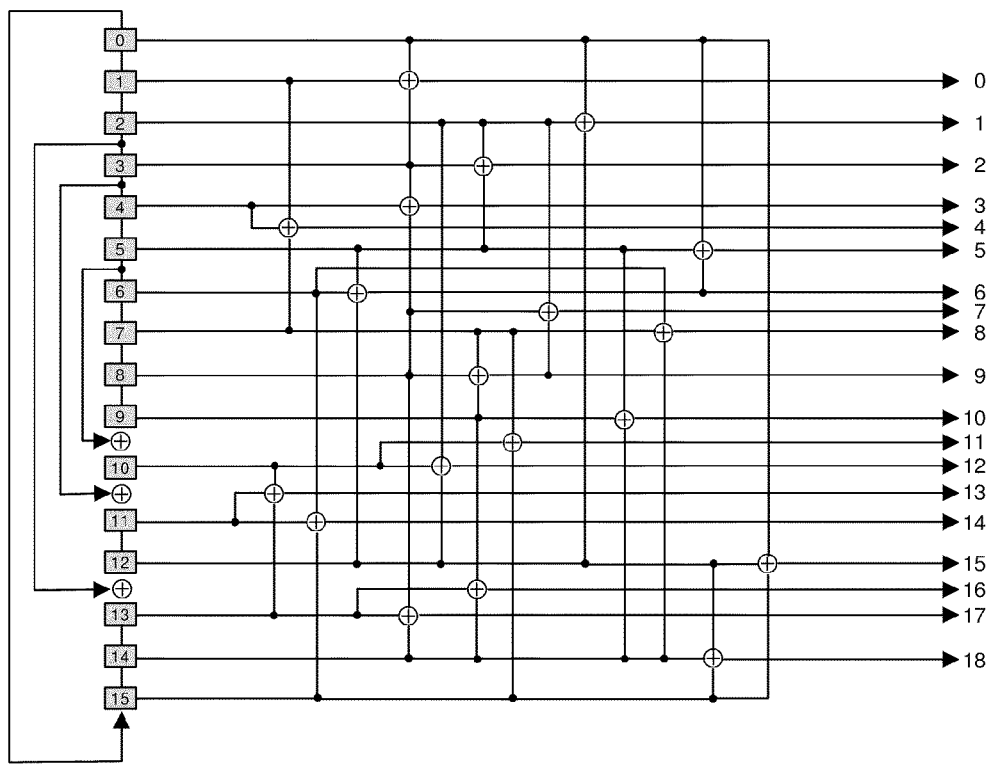
FIG. 8 is a circuit diagram of a phase shifter synthesized according to the present invention.
Figure 9:
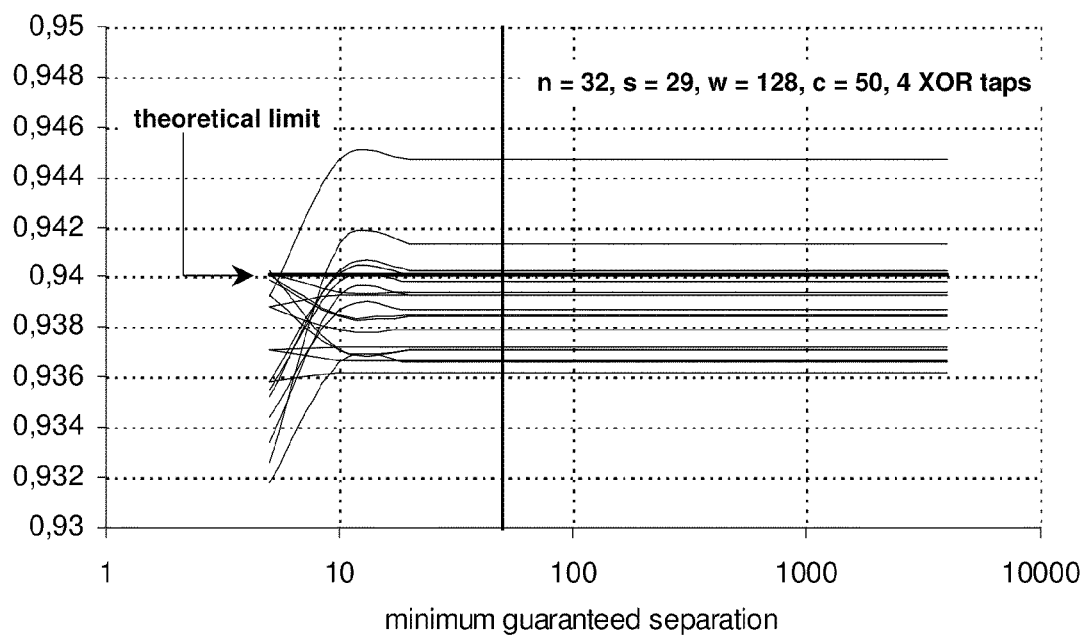
FIG. 9 is a graph illustrating the relationship between the interchannel separation and the probability of finding a solution for transformed LFSRs with phase shifters.

The code for Algorithm 2 consists of three parts. In each step of the outer while loop the procedure first generates a new XOR taps combination and subsequently checks if this combination can be accepted. If this is the case, the new combination and its corresponding guard combination are added to the list, and the number of generated channels is updated. The actual validation is carried out by an internal while loop. After initialization of the dual t-LFSR, it is first checked whether its current state is on the list of the guard combinations and then a next state of the dual t-LFRS is determined. The loop terminates successfully if counter i reaches the value of the requested interchannel separation. Note that variable rejected immediately invokes a next generation of XOR taps. An example application of Algorithm 2 to synthesize a 19-output phase shifter driven by a t-LFSR implementing a primitive polynomial $x^{16}+x^{10}+x^7+x^4+1$ has resulted in a structure shown in FIG. 8. The entire synthesis process was carried out assuming that each output channel is driven by 3 XOR taps and the minimal interchannel separation is equal to 100.

According to this invention, phase shifters generated as shown above are, in particular, intended to reduce linear dependencies in sequences generated on their outputs. The influence of linear dependencies can be measured in terms of the probability of their occurrence being a function of a channel separation between successive scan chains. With the varying value of the channel displacement and the scan length kept constant, one can determine the required interchannel separation to maximize likelihood of obtaining desired sequences. This is demonstrated in the following examples which consider Monte Carlo experiments performed on a class of phase shifters driven by several t-LFSRs In order to arrive with accurate estimations, the primary objective of simulation experiments was to assess the probability that a given test cube, represented by its specified positions, can be obtained by loading the t-LFSR with appropriate initial (seed) values and exercising it until scan cells are filled with the desired test data. The estimation technique adopted here was based on solving systems of linear equations in the Galois field modulo 2. Given a structure of the t-LFSR, one can form for all scan cells symbolic expressions which are linear combinations of the seed variables. Initially, a set of n seed variables is loaded into the n-bit t-LFSR. Subsequently, at every step (or equivalently every clock cycle) the resulting linear combinations of the seed variables are associated with successive cells of the scan chains driven by the phase shifter outputs. Particular forms of the expressions depend on the feedback network of the t-LFSR and the phase shifter employed. Once the symbolic expressions are determined, a system of equations can be formulated for a given test cube. The equations are obtained by selecting the symbolic expressions corresponding to specified positions of the test cube (they form the left-hand sides of the equations) and assigning values (the right hand sides) of these specified positions to the respective expressions. Solving such a system of equations can be carried out very efficiently using Gauss—Jordan elimination by taking advantage of fast bit-wise operations The initial values for a given test cube exist provided that the system of linear equations corresponding to positions where the test cube features specified positions has a solution. The existence of a solution is quantified by the probabilities of linear independence of the equations, and therefore these probabilities can be employed as a primary measure of a t-LFSR ability to produce required test sequences. Assuming that linearly dependent equations are uniformly distributed across the entire output space of the generator, probabilities of finding the initial values, for various generator sizes and numbers of specified positions, have been derived as is well known in the art. These quantities are used as the reference points.

The Monte Carlo experiments were carried out for n-bit t-LFSR feeding w scan chains, each consisting of c flip-flops. Experiments have been run with phase shifters featuring a limited number of XOR taps and a balanced load of the memory elements of t-LFSR. In the phase shifters with a limited number of XOR taps, the effective interchannel separation is usually much larger than the requested one. This is because many states (their number determines the actual phase shift) of a dual t-LFSR (that could be used to synthesize the phase shifter) appear in its trajectory between two states having the same small number of ones. The main objective of the experiments was to determine the likelihood of obtaining desired values on designated scan cells for varying n, c, and the number of specified positions s. Some typical results for 18 different primitive polynomials used to implement a feedback structure, n=32, s=29, w=128, c=50, and 4 XOR taps are provided in FIG. 7. The plots of this figure show the relationship between the interchannel separation and the probability of finding a solution, and they are characteristic of many other similar results not shown here. The theoretical limiting probability is also shown. Each data point on all curves was obtained by generating 100,000 test cubes. These vectors were generated by randomly selecting specified positions from n×c-bit output space of the generator, and by randomly assigning binary values to them. The results clearly indicate that given a t-LFSR with a phase shifter, the probability of finding the seed variables becomes practically independent of the channel separation.

As can be easily observed, neither primitive polynomials nor the structure of the t-LFSR can influence significantly the results once the properly synthesize phase shifter is placed in. In other words, the optimal performance can be achieved provided that there is no pair of scan chains whose contents overlap.

Having illustrated and described the principles of the illustrated embodiments, it will be apparent to those skilled in the art that the embodiments can be modified in arrangement and detail without departing from such principles.

Although a particular algorithm is disclosed, other algorithms can be used for achieving the balanced loading. For example, the memory elements may be selected first and then loading checked to determine if the selected elements are acceptable, rather than performing a preprocessing.

Still further, although the loading of the memory elements focuses on the number of connections (fanout) of the memory elements, the loading can also take into consideration physical information of the connections, such as resistance, inductance, and capacitance. Such physical information can be affected by the length of interconnections, the width of the paths, etc.

Yet further, it has been observed that an odd number of taps provides a phase shifter with a greater reduction in linear dependency. Thus, functionality may easily be introduced into the selection algorithm to ensure that an odd number of taps are produced, as is well understood in the art.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A built-in-self-test circuit, comprising:
    a linear finite state machine including multiple memory elements with at least one feedback connection between the memory elements, the linear finite state machine having multiple outputs with a substantially balanced load on the outputs;
    a plurality of scan chains for storing test patterns used to test an integrated circuit;
    a phase shifter positioned between the linear finite state machine and the scan chains, the phase shifter including a plurality of inputs coupled in parallel to the multiple outputs of the linear finite state machine.

2. The built-in-self-test circuit of claim 1, wherein the memory elements in the linear finite state machine are flip flops coupled in a ring structure.

3. The built-in-self-test circuit of claim 1, wherein the phase shifter includes XOR gates coupled between the plurality of inputs to reduce correlation of test patterns provided by the linear finite state machine.

4. The built-in-self-test circuit of claim 1, wherein the linear finite state machine can generate output combinations of test patterns with a predetermined interchannel separation.

5. The built-in-self-test circuit of claim 1, wherein the linear finite state machine is a linear feedback shift register or cellular automata.

6. One or more computer-readable media storing circuit design information for implementing the apparatus of claim 1.

7. A method for creating a built-in-self-test circuit, comprising:
    generating a linear feedback shift register having multiple flip-flops with outputs of the linear feedback shift register extending from the flip-flops;
    generating a phase shifter coupled to the linear feedback shift register by randomly selecting the outputs of the linear feedback shift register for coupling to the phase shifter and checking whether the randomly selected outputs will provide adequate interchannel separation that exceeds a predetermined limit and whether loading on the outputs of the linear feedback shift register is substantially evenly distributed;
    coupling outputs of the phase shifter to a plurality of scan chains for storing test patterns generated by the linear feedback shift register and the phase shifter.

8. The method of claim 7, further including simulating the linear finite shift register.

9. The method of claim 7, further including generating test patterns and testing an integrated circuit using the generated test patterns.

10. The method of claim 7, wherein the interchannel separation is at least a length of a longest scan chain.

11. The method of claim 7, wherein the flip-flops are coupled in a ring with intermediate feedbacks coupled to logic gates positioned between the flip-flops.

12. The method of claim 7, wherein the phase shifter includes multiple conductors coupled in parallel to respective outputs of the linear feedback shift register and multiple logic gates coupled between the multiple conductors.

13. The method of claim 12, wherein the logic gate includes XOR gates or XNOR gates.

14. The method of claim 7, further including tracking whether a flip-flop has exceeded a loading limit and excluding the flip-flop as being potentially coupled to the phase shifter.

* * * * *